US008822970B2

(12) United States Patent
Jung et al.

(10) Patent No.: US 8,822,970 B2
(45) Date of Patent: Sep. 2, 2014

(54) PHASE-CHANGE MEMORY DEVICE AND FLEXIBLE PHASE-CHANGE MEMORY DEVICE INSULATING NANO-DOT

(75) Inventors: Yeon Sik Jung, Daejeon (KR); Keon Jae Lee, Daejeon (KR); Jae Won Jeong, Daejeon (KR); Jae Suk Choi, Chungcheongnam-do (KR); Geon Tae Hwang, Busan (KR); Beom Ho Mun, Busan (KR); Byoung Kuk You, Gyeonggi-do (KR); Seung Jun Kim, Daejeon (KR)

(73) Assignee: Korea Advanced Institute of Science and Technology (KAIST), Yuseong-Gu, Daejeon (KR)

( * ) Notice: Subject to any disclaimer, the term of this patent is extended or adjusted under 35 U.S.C. 154(b) by 0 days.

(21) Appl. No.: 13/401,449

(22) Filed: Feb. 21, 2012

(65) Prior Publication Data

US 2013/0001502 A1    Jan. 3, 2013

(30) Foreign Application Priority Data

Feb. 21, 2011   (KR) .................. 10-2011-0015021
Aug. 31, 2011   (KR) .................. 10-2011-0088045

(51) Int. Cl.
    *H01L 47/00*   (2006.01)
(52) U.S. Cl.
    USPC ............. 257/4; 257/E21.004; 257/E45.002; 977/773; 977/779
(58) Field of Classification Search
    USPC ........ 257/4, E21.004, E45.002; 977/773, 779
    See application file for complete search history.

(56) References Cited

U.S. PATENT DOCUMENTS

| | | | | |
|---|---|---|---|---|
| 6,980,507 B2* | 12/2005 | Gibson et al. | ................ | 369/126 |
| 7,195,813 B2* | 3/2007 | Burberry et al. | ............. | 428/212 |
| 7,544,966 B2* | 6/2009 | Yang et al. | ..................... | 257/40 |
| 7,787,279 B2* | 8/2010 | Happ et al. | .................... | 365/148 |
| 7,932,507 B2* | 4/2011 | Chen et al. | ....................... | 257/2 |
| 7,981,697 B2* | 7/2011 | Wang | ............................... | 438/3 |
| 8,049,202 B2* | 11/2011 | Khang et al. | ..................... | 257/5 |
| 8,080,460 B2* | 12/2011 | Sandhu et al. | ............... | 438/328 |
| 8,088,654 B2* | 1/2012 | Kusumoto et al. | ........... | 438/151 |
| 8,183,665 B2* | 5/2012 | Bertin et al. | ................. | 257/529 |
| 8,212,238 B2* | 7/2012 | Kato et al. | ...................... | 257/40 |
| 2005/0094533 A1* | 5/2005 | Gibson | ....................... | 369/100 |
| 2006/0131569 A1* | 6/2006 | Choi et al. | ..................... | 257/40 |
| 2006/0154432 A1* | 7/2006 | Arai et al. | ..................... | 438/385 |
| 2007/0051935 A1* | 3/2007 | Lee et al. | .......................... | 257/1 |
| 2008/0246076 A1* | 10/2008 | Chen | ............................ | 257/316 |
| 2008/0268288 A1* | 10/2008 | Jin | ................................ | 428/800 |
| 2010/0252802 A1* | 10/2010 | Numata et al. | .................... | 257/9 |
| 2011/0084321 A1* | 4/2011 | Tsurume et al. | ............. | 257/288 |
| 2011/0186799 A1* | 8/2011 | Kai et al. | .......................... | 257/3 |
| 2011/0297915 A1* | 12/2011 | Tian et al. | ...................... | 257/21 |
| 2012/0056149 A1* | 3/2012 | Cleavelin et al. | ................. | 257/9 |
| 2012/0064309 A1* | 3/2012 | Kwon et al. | ............. | 428/195.1 |
| 2012/0187332 A1* | 7/2012 | Iruvanti et al. | ................. | 252/73 |
| 2013/0063898 A1* | 3/2013 | Schuett et al. | ................ | 361/704 |

* cited by examiner

*Primary Examiner* — Ida M Soward
(74) *Attorney, Agent, or Firm* — Hershkovitz & Associates, PLLC; Abraham Hershkovitz

(57) ABSTRACT

Provided are a phase-change memory device using insulating nanoparticles, a flexible phase-change memory device and a method for manufacturing the same. The phase-change memory device includes an electrode, and a phase-change layer in which a phase change occurs depending on heat generated from the electrode, wherein insulating nanoparticles formed from a self-assembled block copolymer are provided between the electrode and the phase-change layer undergoing crystallization and amorphization.

5 Claims, 49 Drawing Sheets

FIG. 13(a) 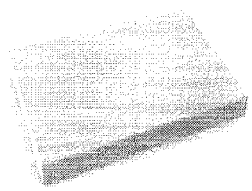  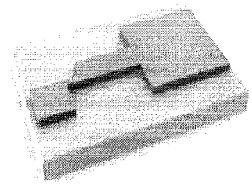 FIG. 13(b)
Si/SiO₂ wafer      TiW(BE) deposition
FIG. 13(c) 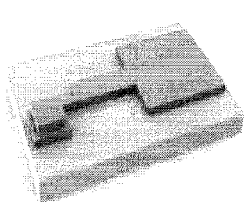   FIG. 13(d)
GST deposition      PEO deposition / hole pattern
FIG. 13(e)    FIG. 13(f)    FIG. 13(g)
I. PS-PDMS
(Styrene-b-dimethylsiloxane)
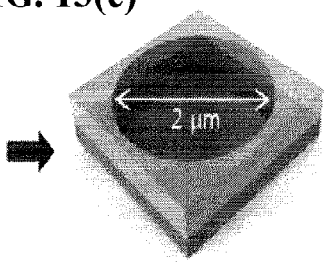  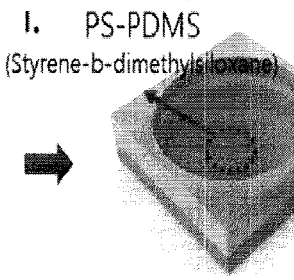 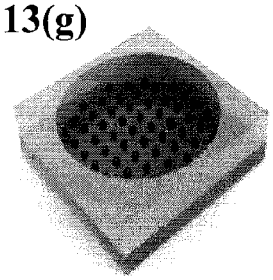
2 μm (diameter) contact hole      PS-PDMS spin-coating      CF₄ and O₂ plasma after solvent annealing
 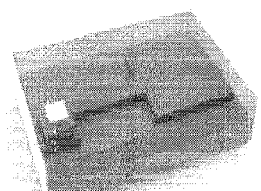  
TiN deposition      TiW(TE) deposition
FIG. 13(h)      FIG. 13(i)

PHASE-CHANGE MEMORY DEVICE AND FLEXIBLE PHASE-CHANGE MEMORY DEVICE INSULATING NANO-DOT

CROSS-REFERENCE TO RELATED APPLICATIONS

The present application claims priority under 35 U.S.C. 119 of Korean Patent Application No. 10-2011-0015021, filed on Feb. 21, 2011, and Korean Patent Application No. 10-2011-10 0088045, filed on Aug. 31, 2011, the disclosures of which are expressly incorporated by reference herein in its entirety.

TECHNICAL FIELD

The following disclosure relates to a phase-change memory device using insulating nanoparticles, a flexible phase-change memory device and a method for manufacturing the same. More particularly, the following disclosure relates to a phase-change memory device using insulating nanoparticles, which is capable of reducing RESET current by reducing contact area between an electrode and a phase-change material with the aid of insulating nanoparticles obtained from a block copolymer, a flexible phase-change memory device, and a method for manufacturing the same.

BACKGROUND

In general, a phase-change memory (random access memory: RAM, parameter-RAM: P-RAM) device is the next generation memory semiconductor judging a phase change of a specific material and storing data. Such a phase-change memory device uses crystal states of a phase-change material, such as a calcogenide compound (Ge—Sb—Te: GST) containing germanium (Ge), antimony (Sb) and tellurium (Te). The phase-change memory device stores data in such a manner that it detects signal 1 in the case of a phase-change material present in a crystalline state, and detects signal 0 in the case of a phase-change material present in an amorphous state. Thus, the phase-change memory device has advantages of both flash memory, in which stored data are not deleted even if its power source is interrupted, and dynamic random access memory (DRAM), in which stored data are extinguished upon interruption of its power source but a high processing rate is realized. However, as integration density of a semiconductor device increases, it becomes very difficult to fabricate an ultrafine phase-change memory, particularly a micropatterned phase-change memory device in a large scale due to a unique limitation in photolithography technology for forming patterns and holes.

In other words, Joule heating occurs at an interface between a bottom electrode of phase-change memory and a phase-change material, and an extent of RESET current increases in proportion to the magnitude of interface area. In addition, as RESET current increases, power consumption of a device increases accordingly ($P=I^2R$). Therefore, it is required to reduce the area of an electrode, particularly a bottom electrode, systematically to reduce RESET current. In this context, there is a problem in that critical dimension (CD) decreases as a device integration degree increases and thus photolithography processes reach the technological limit, while processes of reducing CD of a bottom electrode contact (BEC) also reach the technological limit. In other words, since the area between a phase-change material and an electrode is reduced significantly due to upsizing and high integration of memory devices, it is very difficult to control such a fine contact area between the phase-change layer and the electrode. Therefore, there is an imminent need for technology controlling the threshold value of RESET current, which is the minimum current extent capable of changing crystal states of a phase-change layer, by adjusting area between the phase-change layer and the electrode.

SUMMARY

An embodiment of the present disclosure is directed to providing a novel phase-change memory device and flexible phase-change memory device capable of reducing RESET current by reducing contact area between a phase-change layer and an electrode.

Another embodiment of the present disclosure is directed to providing a method for manufacturing a novel flexible phase-change memory device capable of reducing RESET current by reducing contact area between a phase-change layer and an electrode.

In one general aspect, there is provided a phase-change memory device including: an electrode; and a phase-change layer in which a phase change occurs depending on heat generated from the electrode, wherein insulating nanoparticles formed from a self-assembled block copolymer are provided between the electrode and the phase-change layer undergoing crystallization and amorphization.

According to an embodiment, the electrode may be a bottom electrode disposed below the phase-change layer and may be subjected to patterning in such a manner that specific polymer blocks are removed from the block copolymer.

According to another embodiment, the phase-change layer and the electrode may be in contact with each other at a region of selectively removed polymer blocks, and the crystal type of the phase-change layer may be changed depending on the heat generated from the electrode.

According to still another embodiment, the phase-change layer and the electrode may not be in contact with each other at a region of non-removed polymer blocks in the block copolymer.

According to still another embodiment, the block copolymer may be any one selected from the group consisting of polystyrene-polydimethylsiloxane, polystyrene-polymethylmethacrylate, polystyrene-poly(2-vinylpyridine), poly(2-vinylpyridine)-polydimethylsiloxane, and polystyrene-polyferrocenylsilane.

According to still another embodiment, the block copolymer may be a silicon-containing block copolymer and the insulating nanoparticles may include silicon oxide. In addition, the block copolymer may be polystyrene-polydimethylsiloxane or polystyrene-polyferrocenylsilane.

In another general aspect, there is provided a flexible phase-change memory device having the above-described phase-change memory device disposed on a flexible substrate.

In still another general aspect, there is provided a method for manufacturing a phase-change memory device including a phase-change layer, and an electrode applying heat to the phase-change layer to cause crystallization or amorphization of the phase-change layer material, the method including: applying a block copolymer to the electrode, followed by annealing, to perform self-assemblage of the block copolymer; removing a portion of polymer blocks of the self-assembled block copolymer to form insulating nanoparticles; and stacking a phase-change layer on the electrode and the insulating nanoparticles, wherein the phase-change layer and the electrode are in contact with each other at a region of the removed blocks.

According to an embodiment, the method may further include stacking a brush layer on the electrode, wherein the electrode may include titanium nitride (TiN) and the phase-change layer may include a calcogenide compound.

According to another embodiment, the block copolymer may be any one selected from the group consisting of polystyrene-polydimethylsiloxane copolymers, polystyrene-polymethylmethacrylate, polystyrene-poly(2-vinylpyridine), poly(2-vinylpyridine)-polydimethylsiloxane, and polystyrene-polyferrocenylsilane.

In still another general aspect, there is provided a phase-change memory device obtained by the above-described method.

In yet another general aspect, there is provided a flexible phase-change memory device including a flexible substrate, and a phase-change memory device disposed on the flexible substrate and including a phase-change layer and a bottom electrode, wherein insulating nanoparticles formed from a block copolymer is interposed between the phase-change layer and the bottom electrode.

According to an embodiment, the flexible phase-change memory device may include: a silicon semiconductor; a doped source/drain layer formed on the silicon semiconductor; a word-line electrode and a bit-line electrode each connected to a doped region of the doped source/drain layer; and a bottom electrode and a phase-change layer stacked sequentially on the bit-line electrode. The silicon semiconductor may be monocrystalline silicon.

BRIEF DESCRIPTION OF THE DRAWINGS

The above and other aspects, features and advantages of the disclosed exemplary embodiments will be more apparent from the following detailed description taken in conjunction with the accompanying drawings in which:

FIG. 13 is a schematic flow diagram illustrating the method for manufacturing a phase-change memory device according to an embodiment;

DETAILED DESCRIPTION OF EMBODIMENTS

Figure 1:
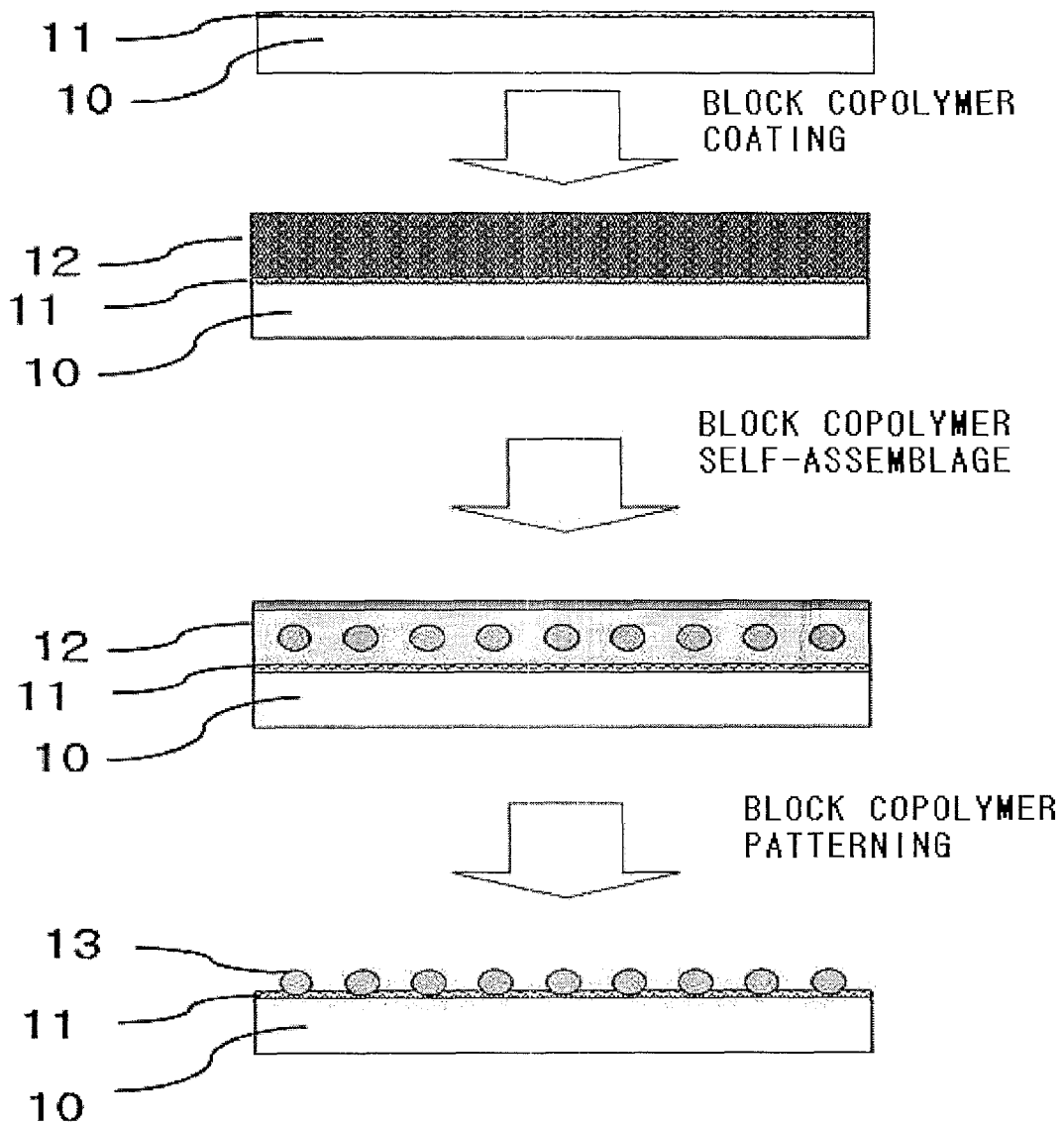
FIG. 1 is a sectional view showing the flow diagram of the method for manufacturing a phase-change memory device according to an embodiment.
Figure 2:
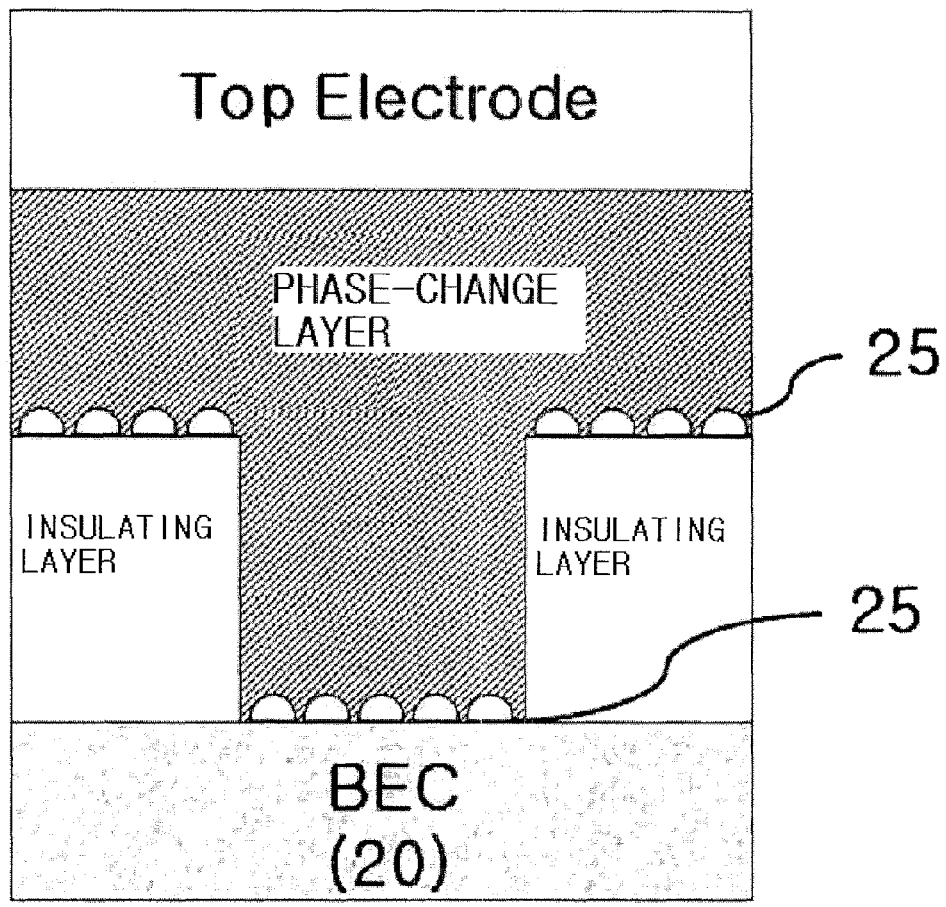
FIG. 2 to FIG. 6 are sectional views showing a self-assembled block copolymer in various types of phase-change memory devices.
Figure 3:
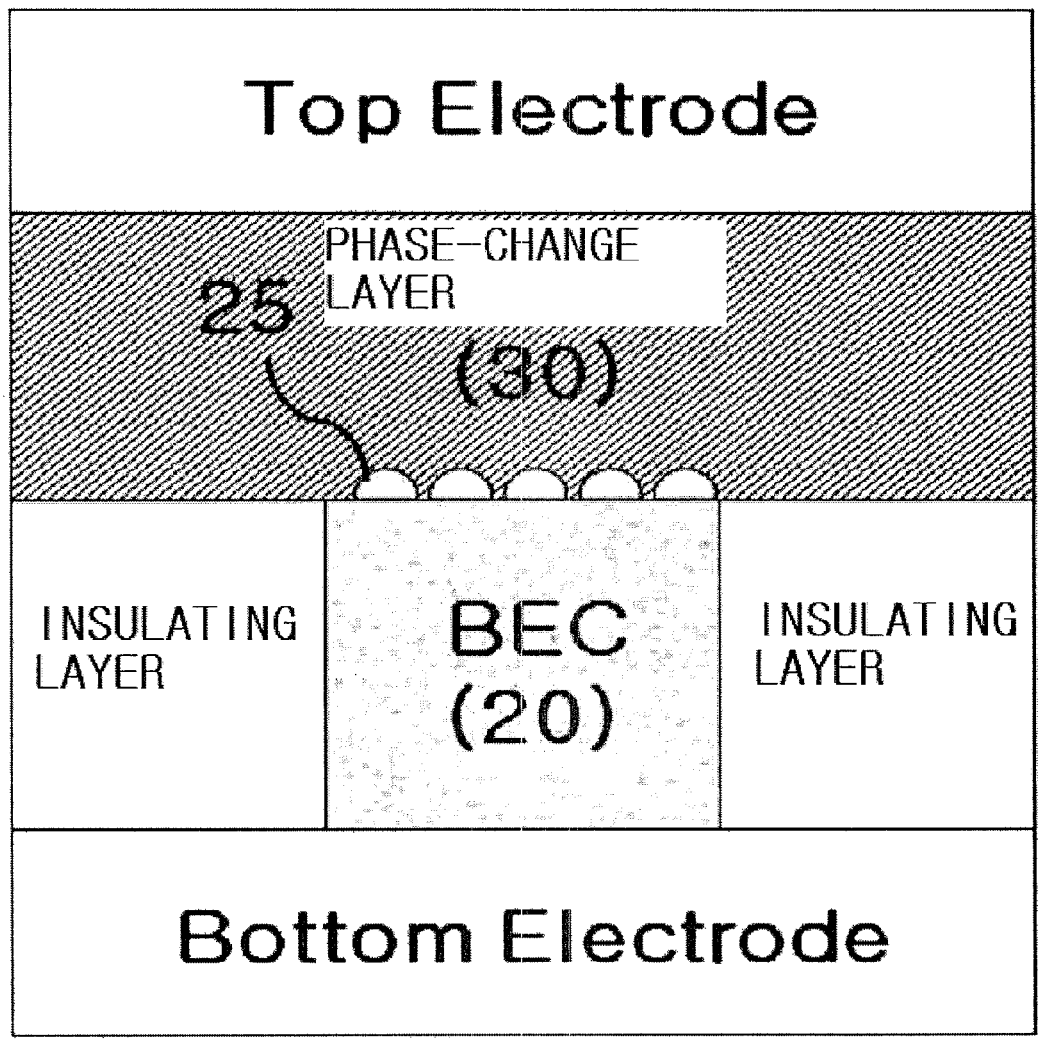
Figure 4:
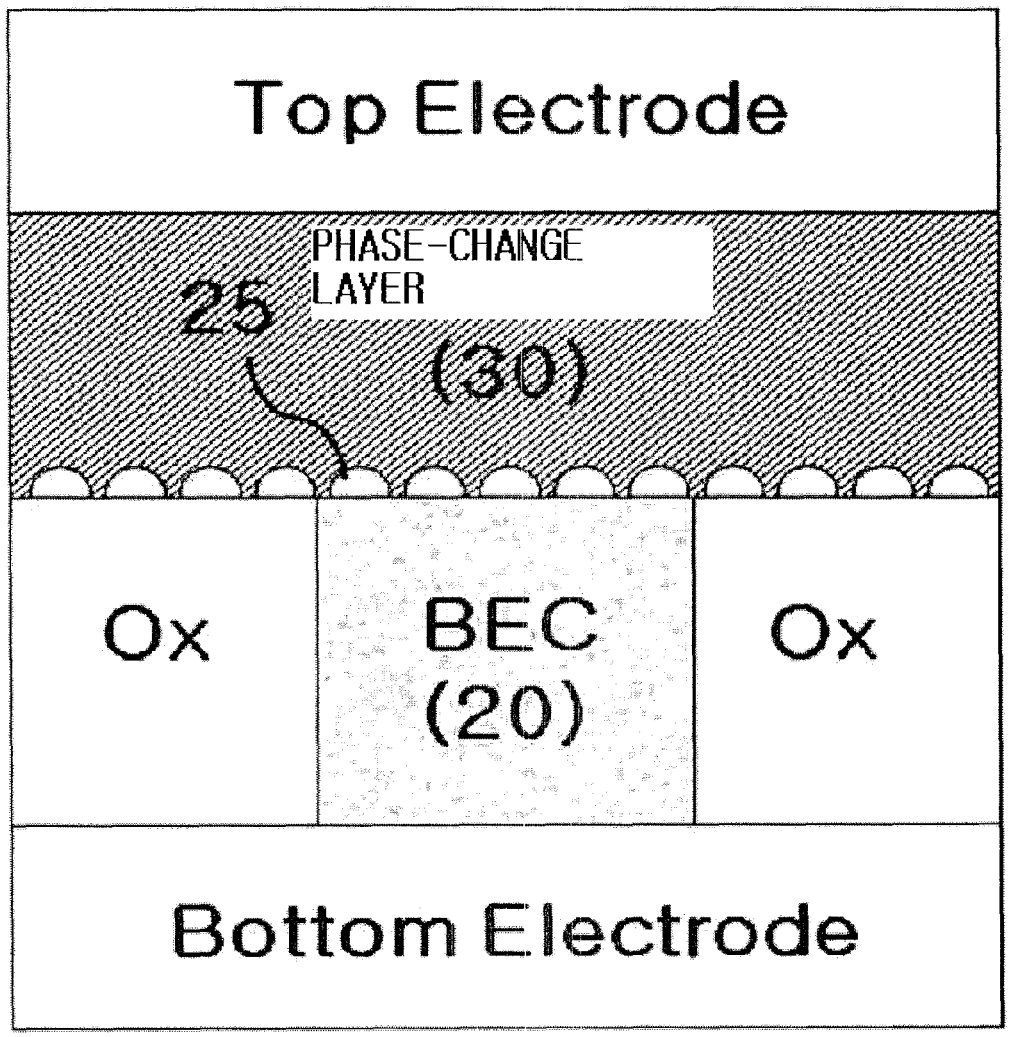
Figure 5:
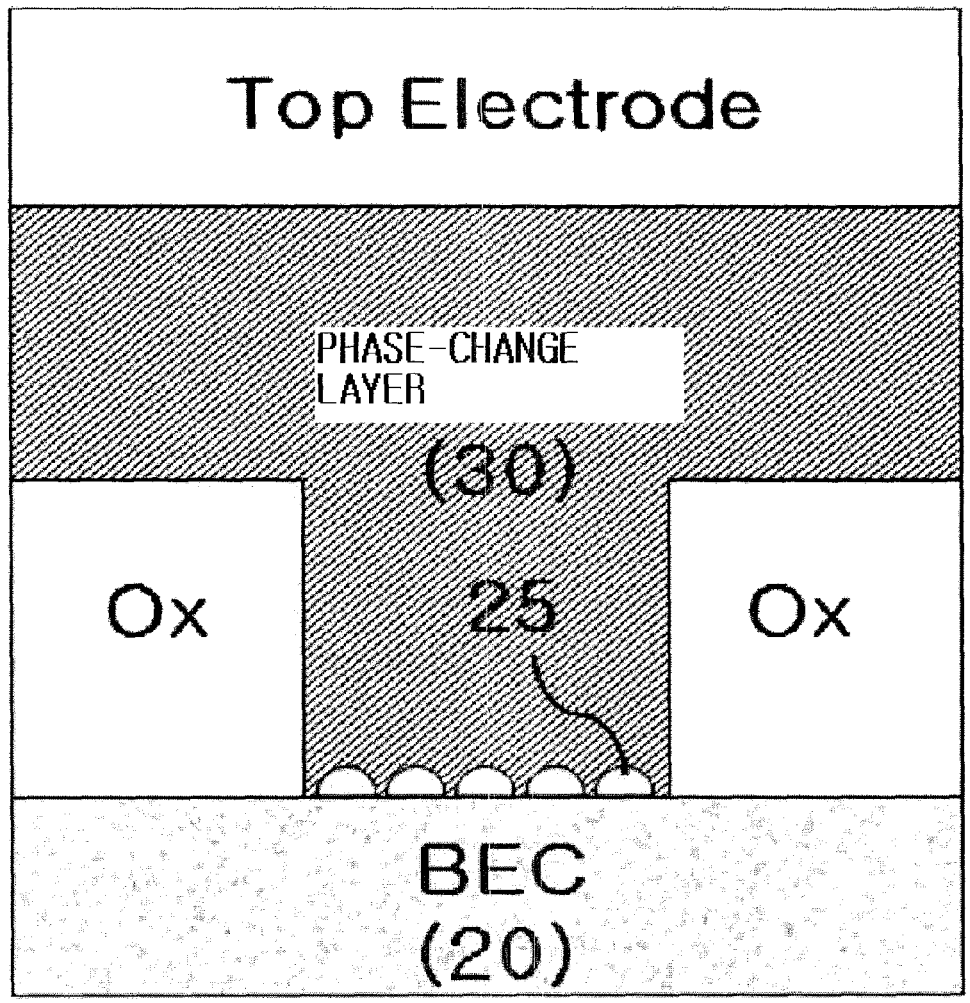
Figure 6:
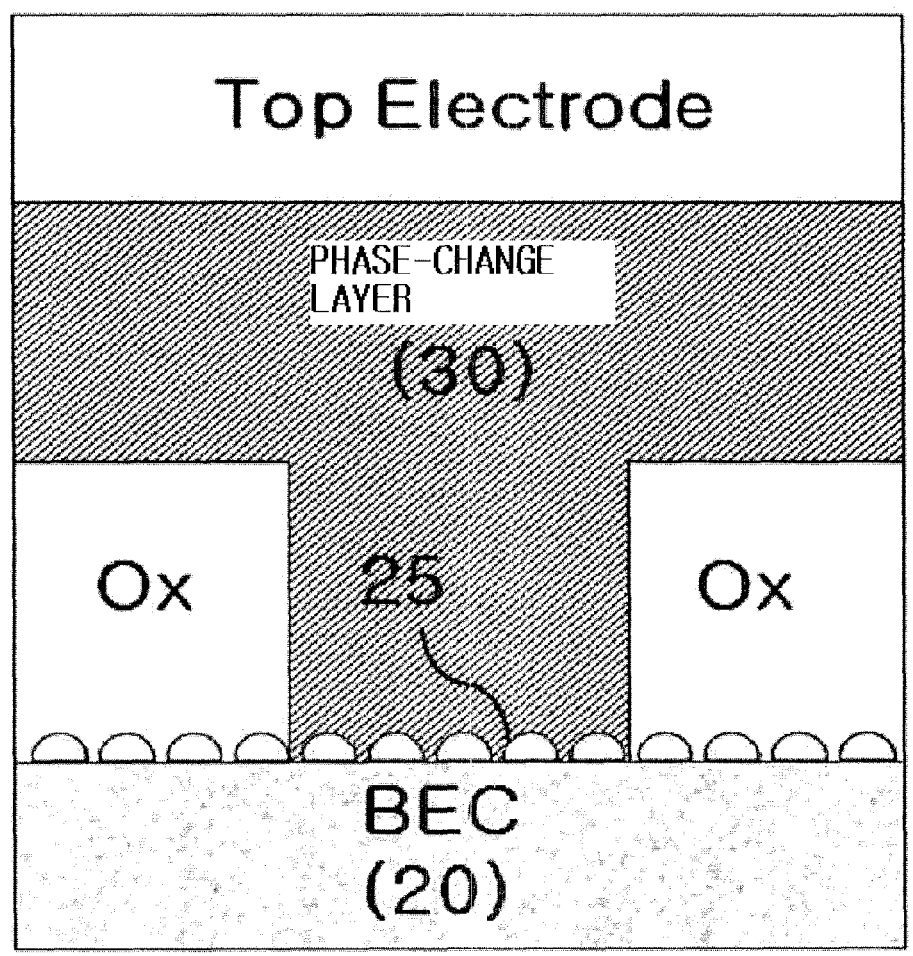

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments. In the drawings, like reference numerals denote like elements. The shape, size and regions, and the like, of the drawing may be exaggerated for clarity.

We have focused on the problems occurring in the related art and have conducted many studies to overcome the problems related with an increased contact area between an electrode in which Joule heating occurs and a phase-change material layer (also referred to as a phase-change layer hereinafter) and thus an increase in RESET current. In one aspect, the phase-change memory device disclosed herein includes an electrode, and a phase-change layer undergoing a change in crystal type depending on Joule heat generated from the electrode, wherein insulating nanoparticles formed by a self-assembled block copolymer is provided between the electrode and the phase-change layer.

As used herein, the term 'electrode' means an electrode generating Joule heat by electric energy supplied thereto. According to an embodiment, the electrode is a bottom electrode disposed below the phase-change layer, but is not limited thereto. In other words, according to an embodiment, the bottom electrode includes an electrode having higher resistance in the electrodes disposed both sides of the phase-change layer to generate heat by electric power applied thereto, thereby causing a change in crystal state of the phase-change layer.

According to an embodiment, a portion of polymer blocks remaining on the electrode serves to reduce the contact area between the bottom electrode contact and the phase-change layer, thereby reducing switching current. Further, there is provided a flexible phase-change memory device including a phase-change memory device with reduced RESET current formed on a plastic substrate.

FIG. 1 is a sectional view showing the flow diagram of the method for manufacturing a phase-change memory device according to an embodiment.

Referring to FIG. 1, a brush layer 11 is stacked first on a substrate 10, a bottom electrode. The brush layer is intended to improve alignment in the structure self-assembled by phase separation. For example, homopolymers, such as polystyrene (PS), polydimethylsiloxane (PDMS) or poly(2-vinypyridine) (P2VP) are used in the brush layer.

Next, a solution of block copolymer is further coated on the brush layer 11. Particular examples of the block copolymer include polystyrene-polydimethylsiloxane copolymers, polystyrene-polymethylmetacrylate, polystyrene-poly(2-vinylpyridine), poly(2-vinylpyridine)-polydimethylsiloxane, polystyrene-polyferrocenylsilane, or the like. Particularly, unlike block copolymers based on organic monomers, polydimethylsiloxane or polyferrocenylsilane includes an inorganic material, such as silicon. In this case, such block copolymers containing an inorganic material form insulating nanoparticles of inorganic oxides, such as $SiO_x$ or $FeSi_xO_y$, through the subsequent oxygen plasma etching operation. In this manner, it is possible to obtain a phase-change memory device with high reliability by disposing inorganic insulating nanoparticles having excellent insulating property, chemical resistance and mechanical properties between the electrode and the phase-change layer.

As a solvent for the above-listed block copolymers, toluene, heptanes, acetone, dimethyl formamide (DMF), pentanol, etc. may be used.

Then, the coated block copolymer 12 is subjected to self-assemblage through annealing. According to an embodiment, the annealing may be carried out in a mode of solvent annealing or thermal annealing. Thermal annealing is carried out by heat treatment at room temperature to 300° C. under vacuum or air for 1 minute to several days. In this manner, the polymer blocks are aligned in a predetermined shape so that they have block domains having a predetermined size and shape.

Then, the self-assembled block copolymer is patterned. Through the patterning, specific polymer blocks 13 are removed from the self-assembled block copolymer. As a result, the other polymer blocks 14 remain on the electrode substrate 10, and the remaining blocks reduce the contact area between the phase-change layer and the electrode (substrate 10 herein). The patterning may be carried out by a lift-off or etching process. Both dry etching and wet etching may be used. In the case of dry etching, two-step plasma etching using carbon tetrafluoride ($CF_4$) and oxygen may be carried out. In the case of wet etching, buffered oxide etch (BOE) or hydrogen peroxide etch may be used. Particularly, silicon-containing polymer blocks may be oxidized into silicon oxide in the form of nanoparticles by oxygen plasma etching, and the oxidized silicon oxide nanoparticles have excellent insulating property, mechanical properties and chemical resistance. As a result, it is possible to manufacture and use a stable phase-change memory device.

FIG. 2 to FIG. 6 are sectional views showing a self-assembled block copolymer in various types of phase-change memory devices.

Referring to FIG. 2 to FIG. 6, the self-assembled block copolymer 25 is stacked and coated between the bottom electrode (BEC) 20 and the phase-change layer 30, and the insulating nanoparticles formed by the subsequent patterning (e.g. etching) minimize the contact area between the phase-change layer 30 and the electrode 20. The block copolymer-based insulating nanoparticles disclosed herein may be applied in various sizes and shapes.

Figure 7:
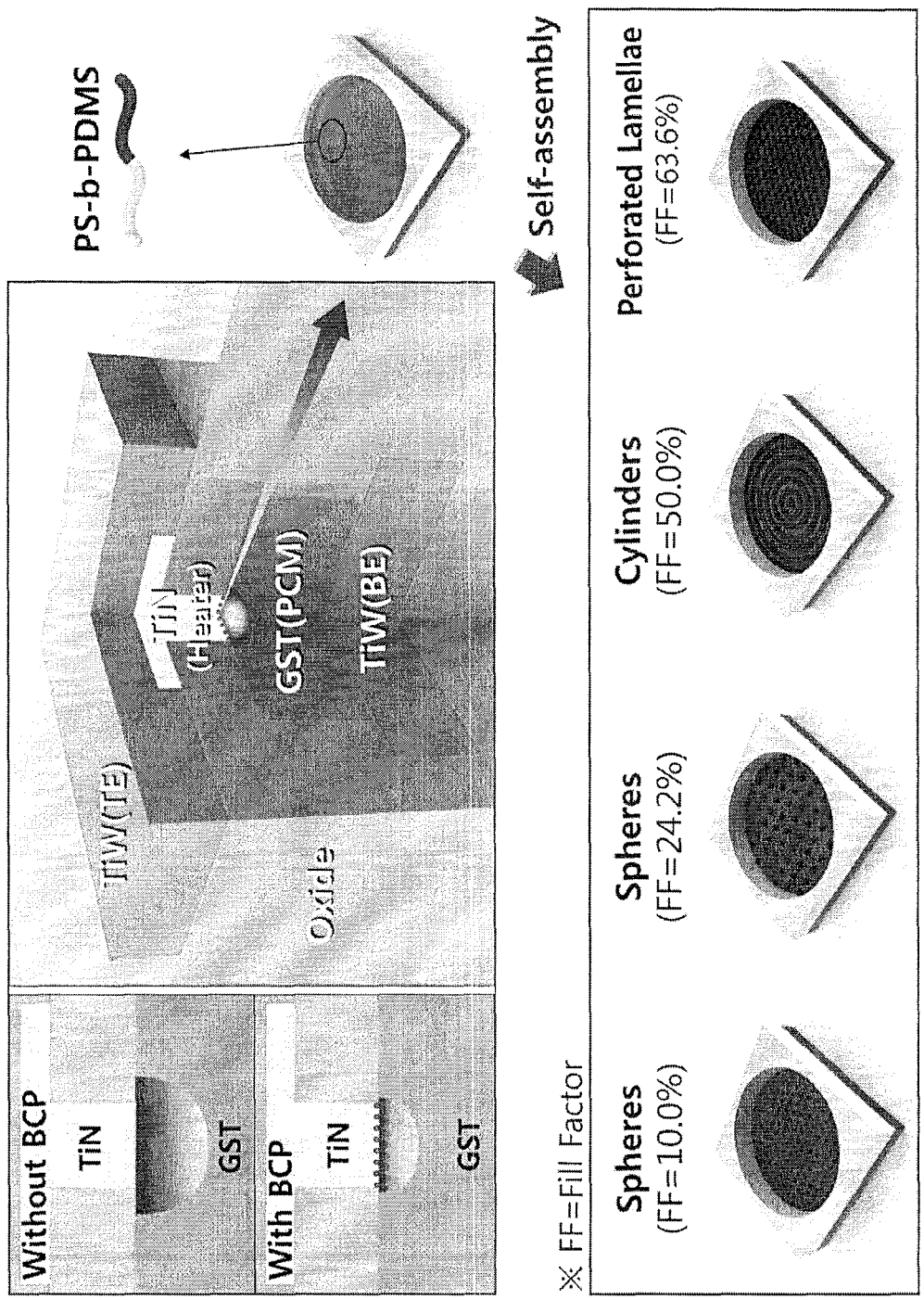
FIG. 7 is a schematic view illustrating an effect of controlling the contact area between TiN as a heat-generating layer of phase-change memory and GST as a phase-change layer by forming various types of self-assembled particles therebetween.

FIG. 7 is a schematic view illustrating an effect of controlling the contact area between TiN as a heat-generating layer of phase-change memory and GST as a phase-change layer by forming various types of self-assembled particles therebetween.

It can be seen from FIG. 7 that the self-assembled particles are formed by PS-b-PDMS, and the contact area is reduced by 10%-63.6%.

FIG. 8 to FIG. 12 are plane views showing various types of patterned block copolymers.

Figure 8:
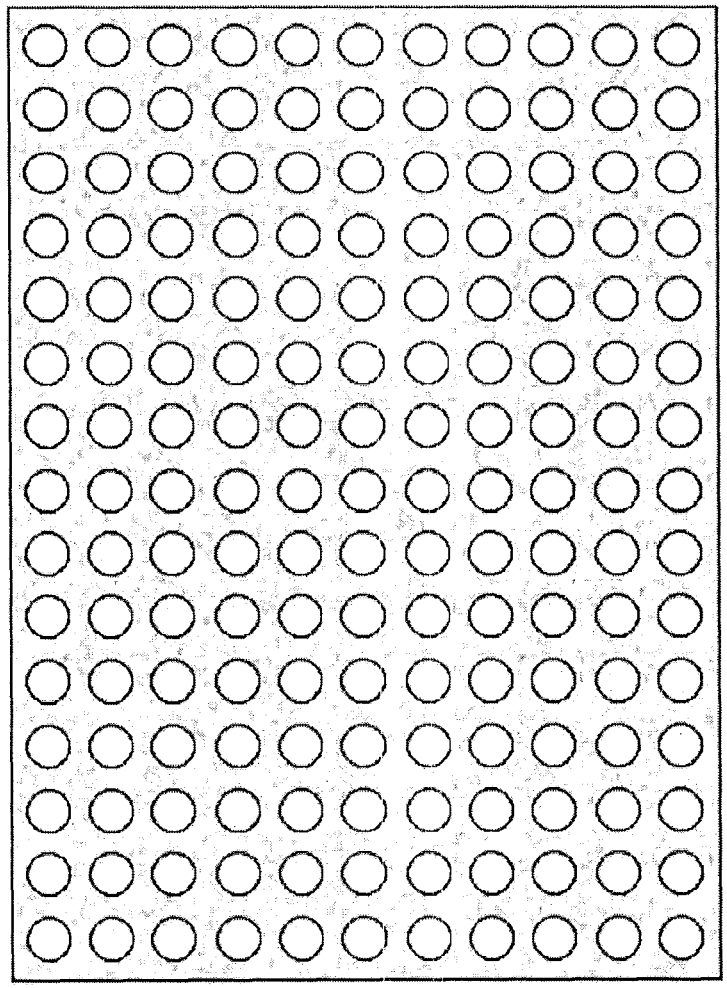
FIG. 8 to FIG. 12 are plane views showing various types of patterned block copolymers.
Figure 9:
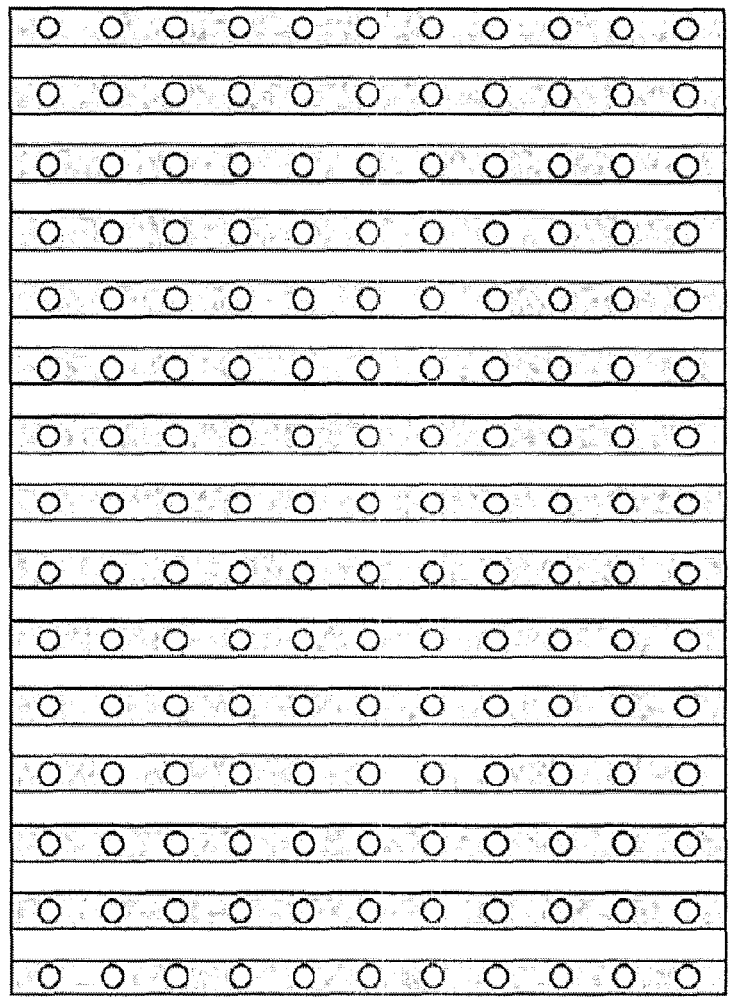
Figure 10:
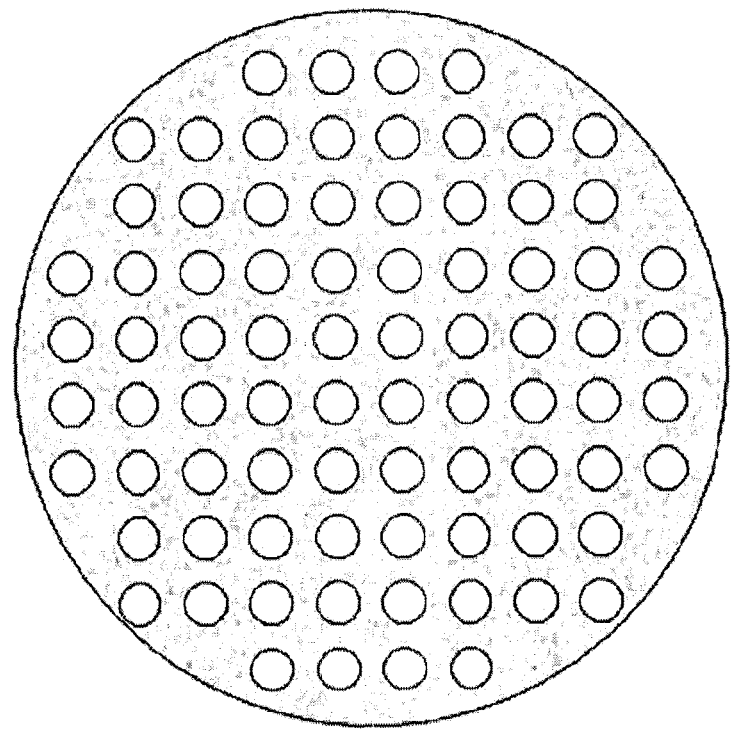
Figure 11:
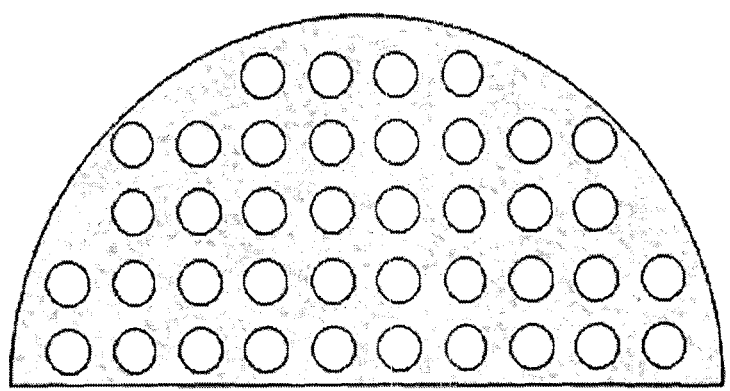
Figure 12:
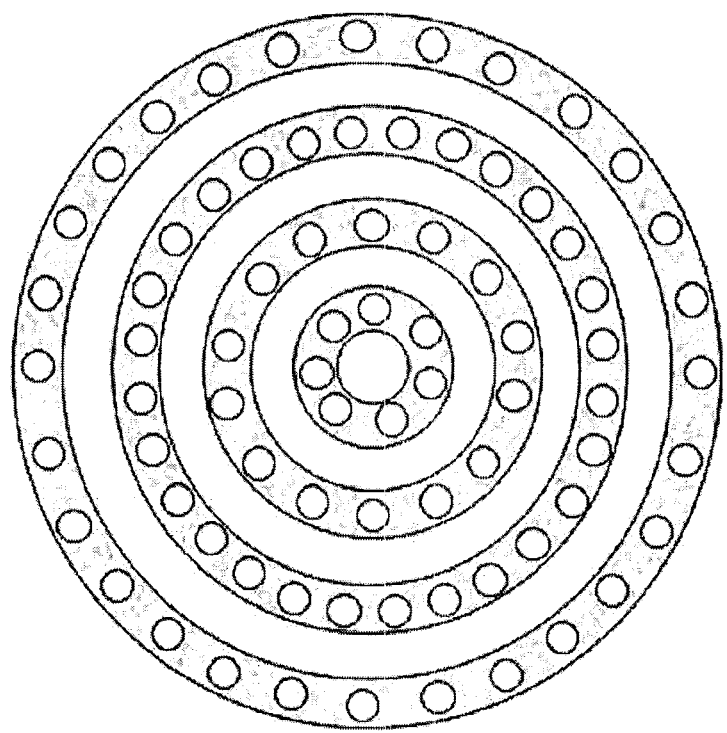

Referring to FIG. 8 to FIG. 12, the block copolymer is self-assembled after it is applied in a solution state. Thus, it is possible to pattern the block copolymer in a predetermined pattern regardless of the size and shape of a device. In FIG. 8, the block copolymer remains on the rectangular electrode in the form of nano-dots or nanoparticles. In FIG. 9, dot-like block copolymer blocks remain on the linear electrode.

In this manner, the block copolymer is applied to a substrate in a liquid state before being annealed. Thus, it is possible to provide a specific type of patterned block copolymer-based insulating nanoparticles on the electrode regardless of the size and shape of the substrate.

In another aspect, there are provided a method for manufacturing a flexible phase-change memory device and a flexible phase-change memory device obtained by the same. Particularly, there are provided a method for manufacturing a flexible phase-change memory device including transferring a substrate of a phase-change memory device to a flexible substrate, and a flexible phase-change memory device provided on the flexible substrate. In this manner, it is possible to overcome limitations caused by a substrate in manufacturing a device and to expand applications of the device.

FIG. 13 is a schematic flow diagram illustrating the method for manufacturing a phase-change memory device according to an embodiment.

Referring to FIG. 13, a silicon substrate on which silicon oxide is deposited to 150 nm is provided (portion a). TiW as a bottom electrode is deposited and patterned to 150 nm (portion b), and then GST as a phase-change material is deposited and patterned to 350 nm (portion c). Then, silicon oxide is further deposited on the front surface to 100 nm and a hole with a diameter of 2 μm is formed (portion d). Portion e shows the hole in a magnified form. Then, PS-b-PDMS is spin-coated (portion f). Heat treatment is carried out under vaporization atmosphere in toluene and heptanes as solvent, and plasma treatment is carried out by using $CF_4$ and $O_2$. In this manner, the PS material is removed and PDMS is converted into silicon oxide, thereby forming a silicon oxide nanostructure (portion g). TiN as a heat generating layer is deposited and patterned on the hole having self-assembled particles to 100 nm (portion h). As a top electrode, TiW is deposited and patterned to 300 nm (portion i).

FIG. 14 to FIG. 27 are schematic views showing operations of the method for manufacturing a flexible phase-change memory device sequentially.

Figure 14:
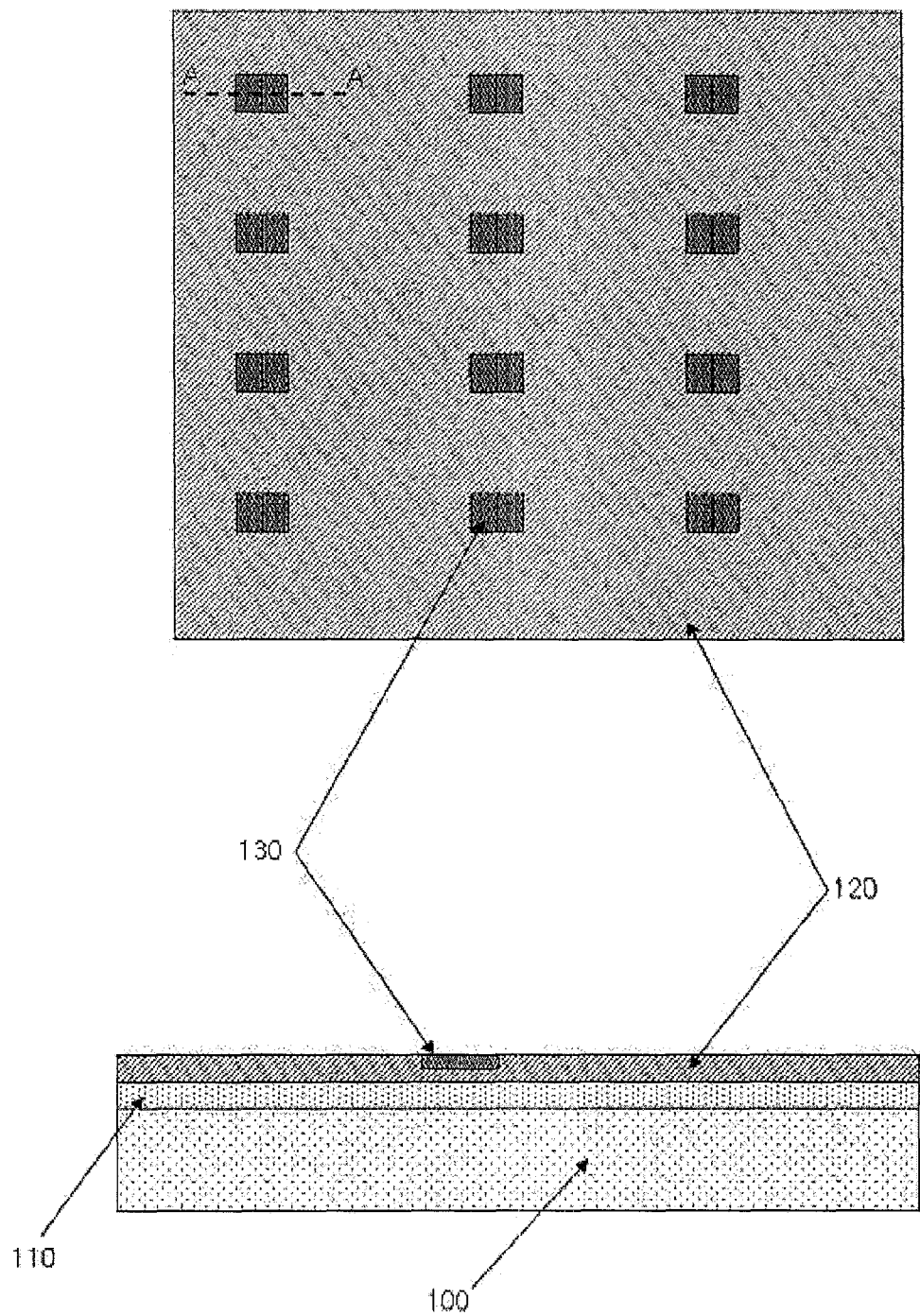
FIG. 14 to FIG. 27 are schematic views showing operations of the method for manufacturing a flexible phase-change memory device sequentially.

Referring to FIG. 14, there is shown a silicon on insulator (SOI) substrate on which a lower bulk silicon layer 100; an insulating layer 110; and a monocrystalline upper silicon layer 120 are stacked successively. On the upper silicon layer 120, a doped source/drain layer 130 having p-type impurities and n-type impurities as dopants is formed. According to an embodiment, multiple doped source/drain layers 130 are formed on the upper silicon layer 120. The doped source/drain layer forms a PN junction diode, and the doped source/drain layer 130 and the upper silicon substrate 120 corresponding thereto form a single memory device substrate. In other words, according to an embodiment, a basic device substrate (i.e., P-N diode substrate) of a phase-change memory device is manufactured on a silicon substrate, and then transferred to a flexible substrate. In this manner, it is possible to obtain a flexible phase-change memory device.

Figure 15:
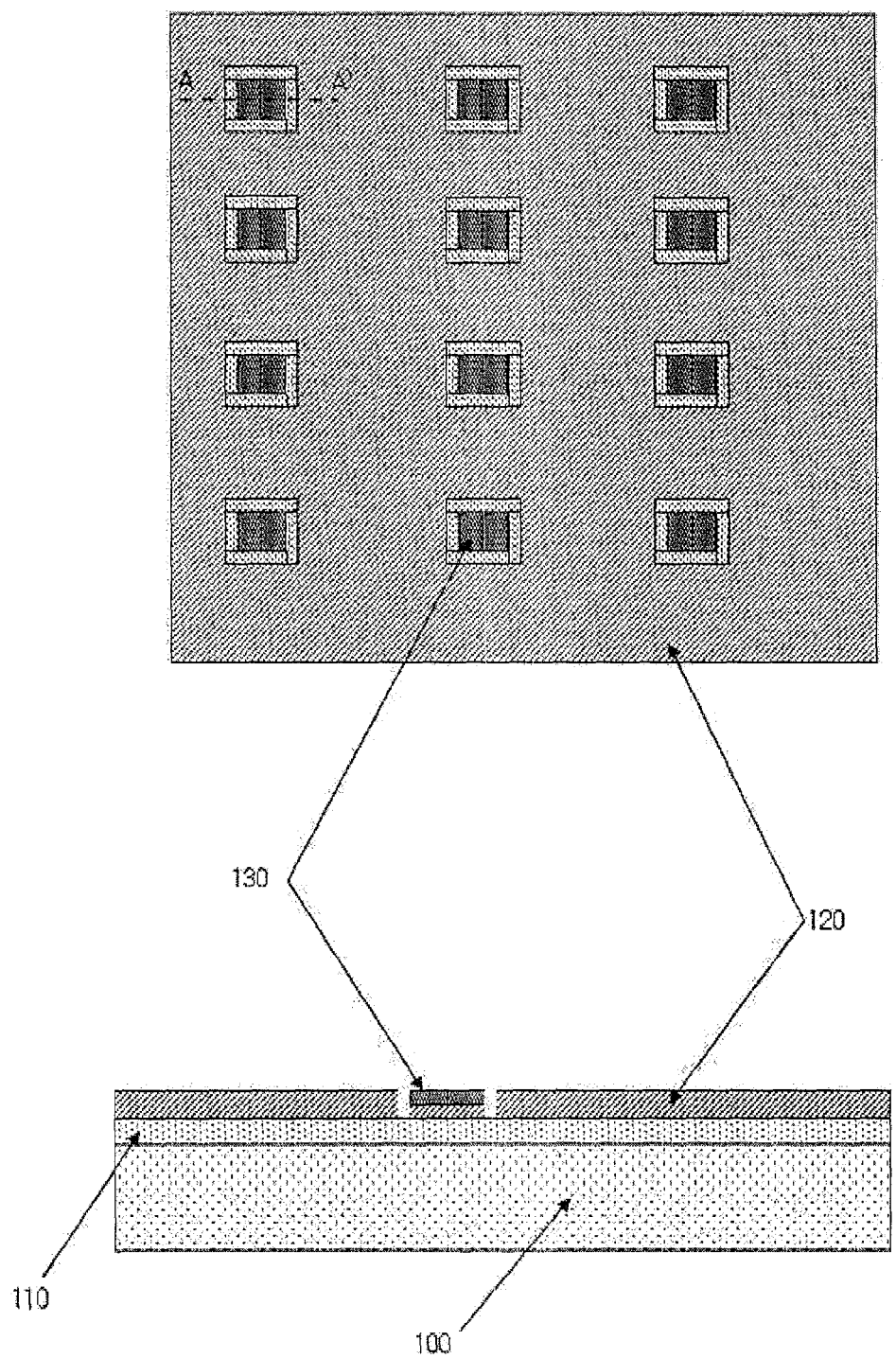

Referring to FIG. 15, the upper silicon layer 120 is etched, so that the insulating layer surrounding the impurity-doped region (i.e., memory device substrate) is exposed. Particularly, according to an embodiment, this etching operation does not etch the whole surroundings of the memory device substrate. If the surroundings of the memory device substrate are etched totally, alignment in the device substrate is unstabilized. Therefore, the memory device substrate 130 may be connected to the surrounding upper silicon layer 120 through a predetermined bridge structure. For example, in FIG. 15, four etching lines are formed around the memory device substrate, and the etching lines may not be connected with each other.

Figure 16:
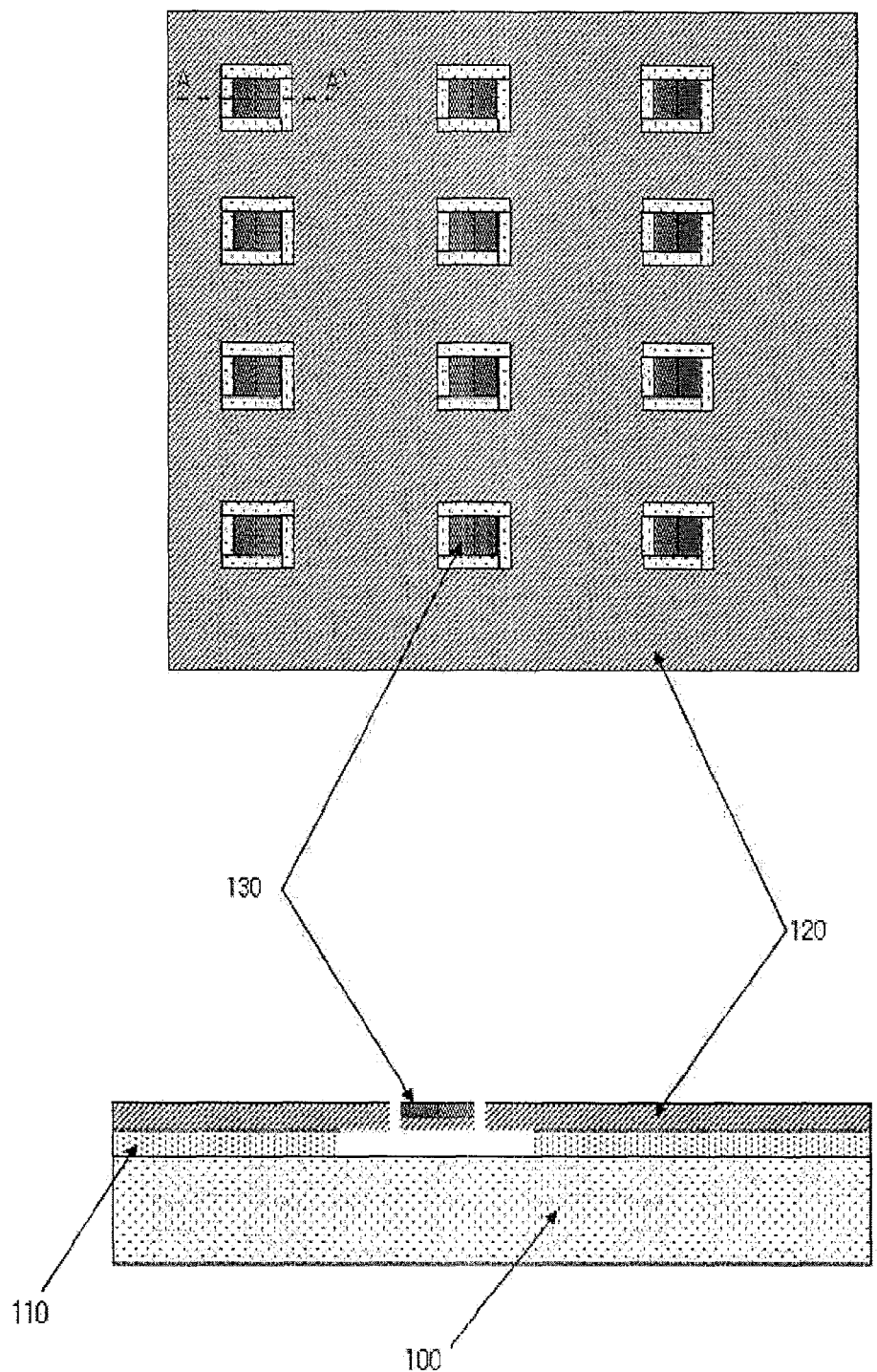

Referring to FIG. 16, the insulating layer exposed to the surroundings of the memory device substrate (i.e., the impurity-doped region) is etched anisotropically. As a result, the memory device substrate (i.e., the doped source/drain layer 130) and the upper silicon layer 120 corresponding thereto are separated from each other. However, the memory device substrate maintains its aligned state by the surrounding upper silicon layer 120 connected with the memory device substrate.

The upper silicon layer 120 may have a thickness conditions capable of providing flexibility and has properties as a semiconductor. Therefore, the upper silicon layer 120 may be referred to as a flexible silicon semiconductor and has a monocrystalline structure. The monocrystalline silicon semiconductor may be transferred from an SOI substrate as described herein. In a variant, the monocrystalline silicon semiconductor may be obtained by laser treatment of an amorphous silicon substrate.

Figure 17:
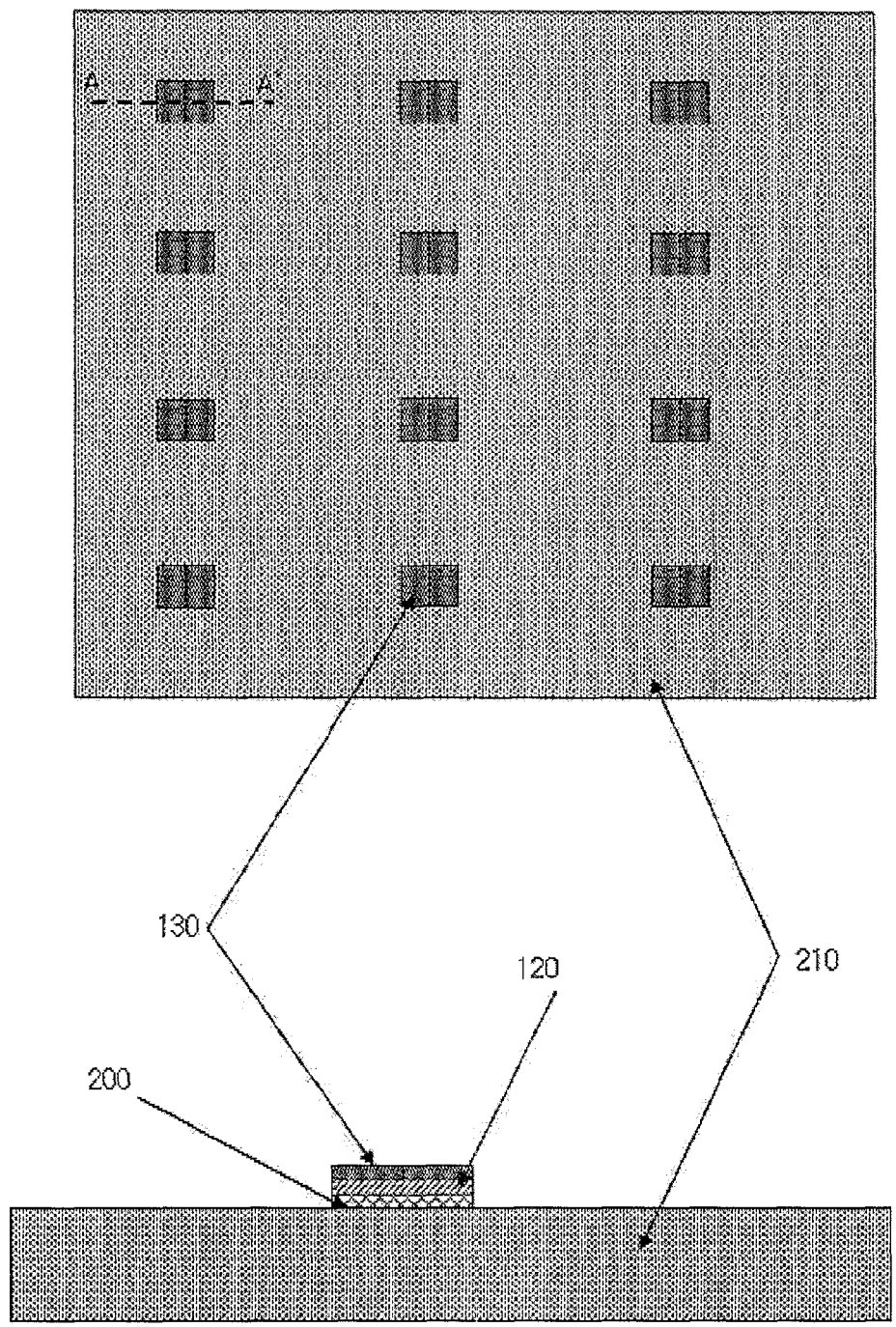

Referring to FIG. 17, the memory device substrate is transferred to a plastic substrate 210 as a flexible substrate. Such transfer may be carried out by attaching the memory device substrate to a transfer layer, such as polydimethylsiloxane (PDMS), followed by transferring to a plastic substrate 210. The plastic substrate may have an adhesive layer, such as polyimide, applied thereto. Therefore, the memory device substrate is separated from the transfer layer or transfer substrate (not shown) depending on adhesion between the adhesive layer 200 and the memory device substrate.

Figure 18:
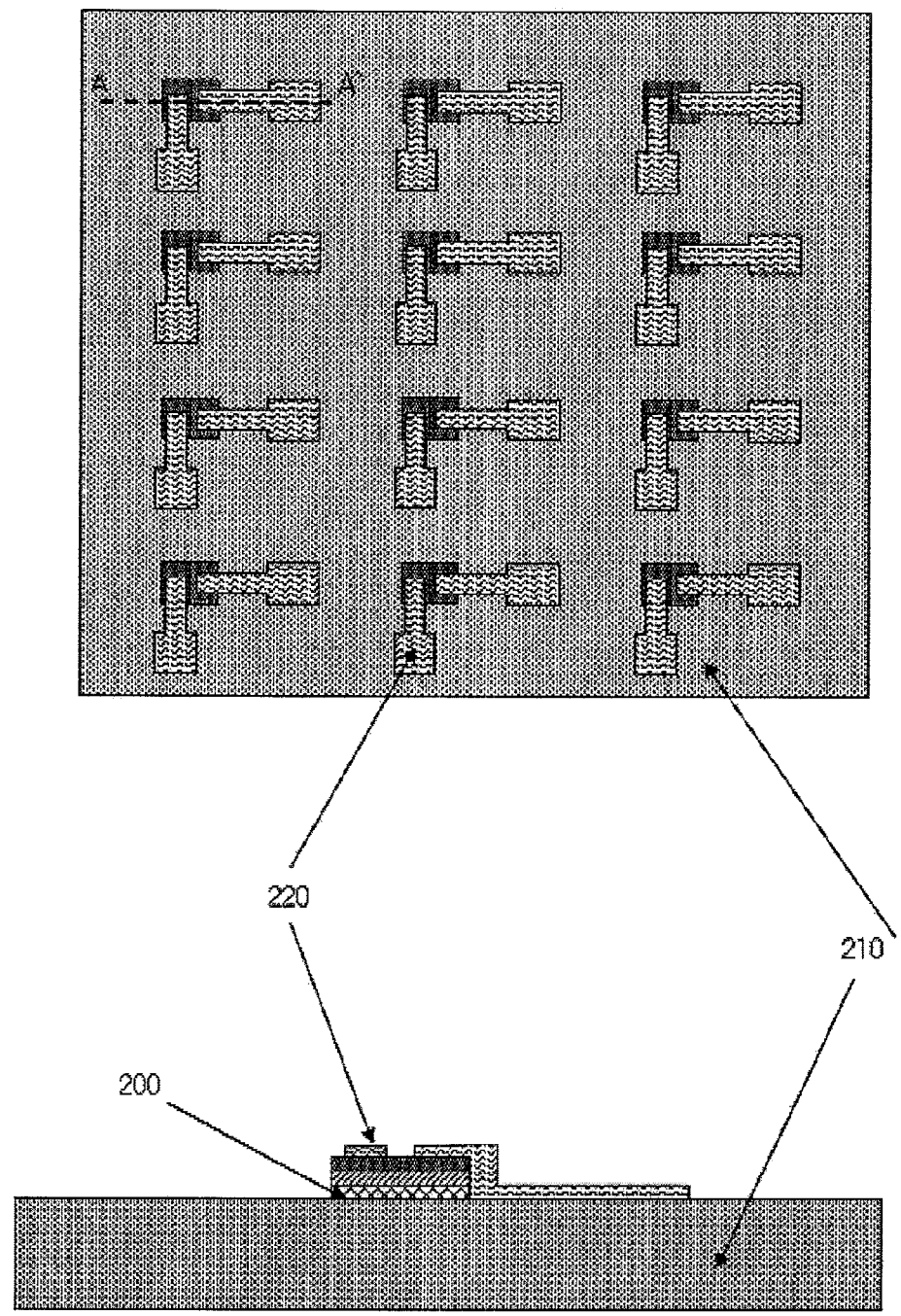

Referring to FIG. 18, a metal electrode 220 is stacked on the doped source/drain layer 130. According to an embodiment, the metal electrode is connected to each of the source region and the drain region, thereby forming a word-line and a bit-line, respectively.

Figure 19:
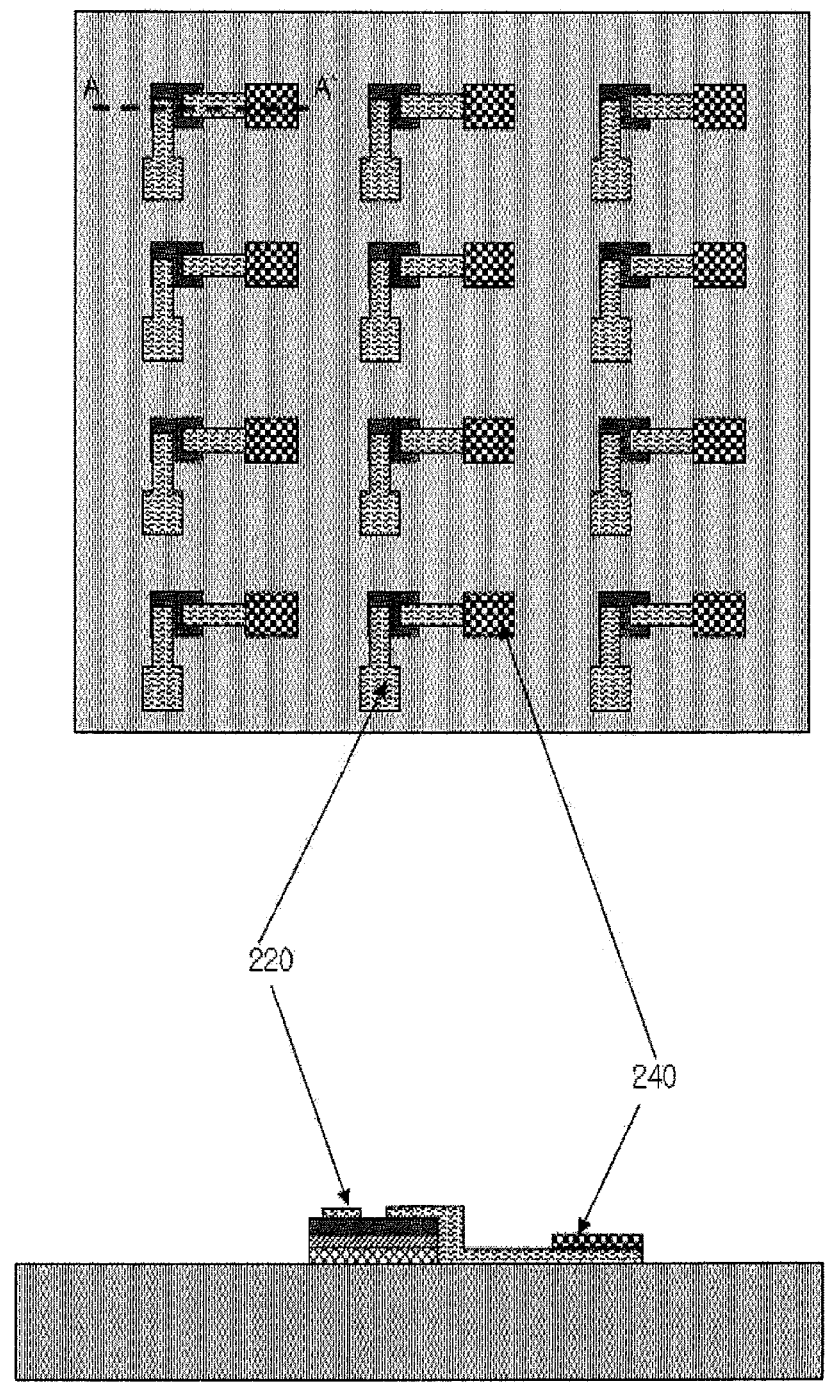

Referring to FIG. 19, a bottom electrode 240 is stacked on the metal electrode 220 connected to the doped source/drain layer 130 of the flexible silicon semiconductor 120. According to an embodiment, the bottom electrode 240 is formed of a material generating heat by resistance caused by voltage application. For example, titanium nitride (TiN) may be used as the bottom electrode 240.

Figure 20:
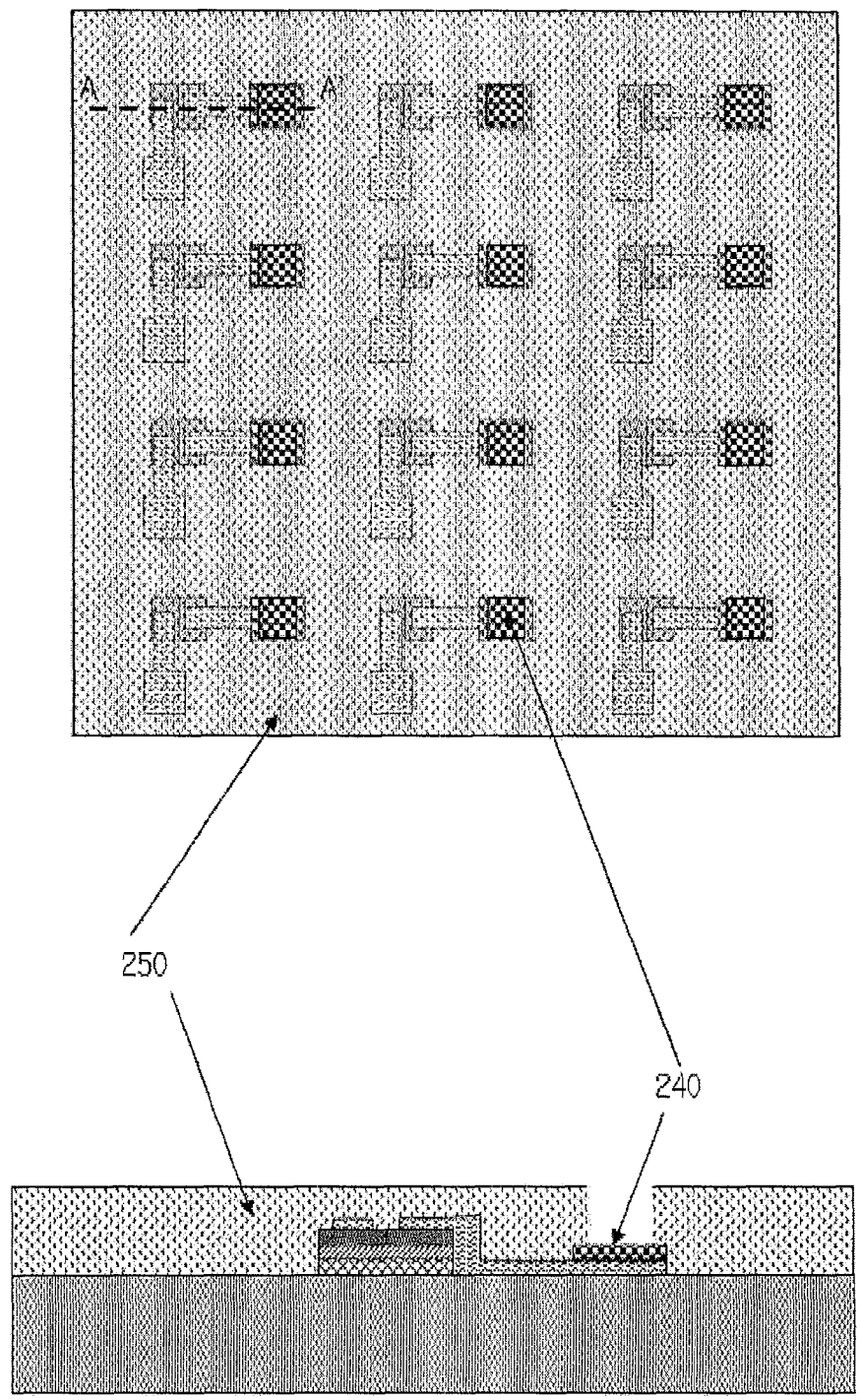

Referring to FIG. 20, a first insulating layer 250 is stacked on the substrate, followed by patterning. Through the patterning, the bottom electrode 240 is exposed partially.

Figure 21:
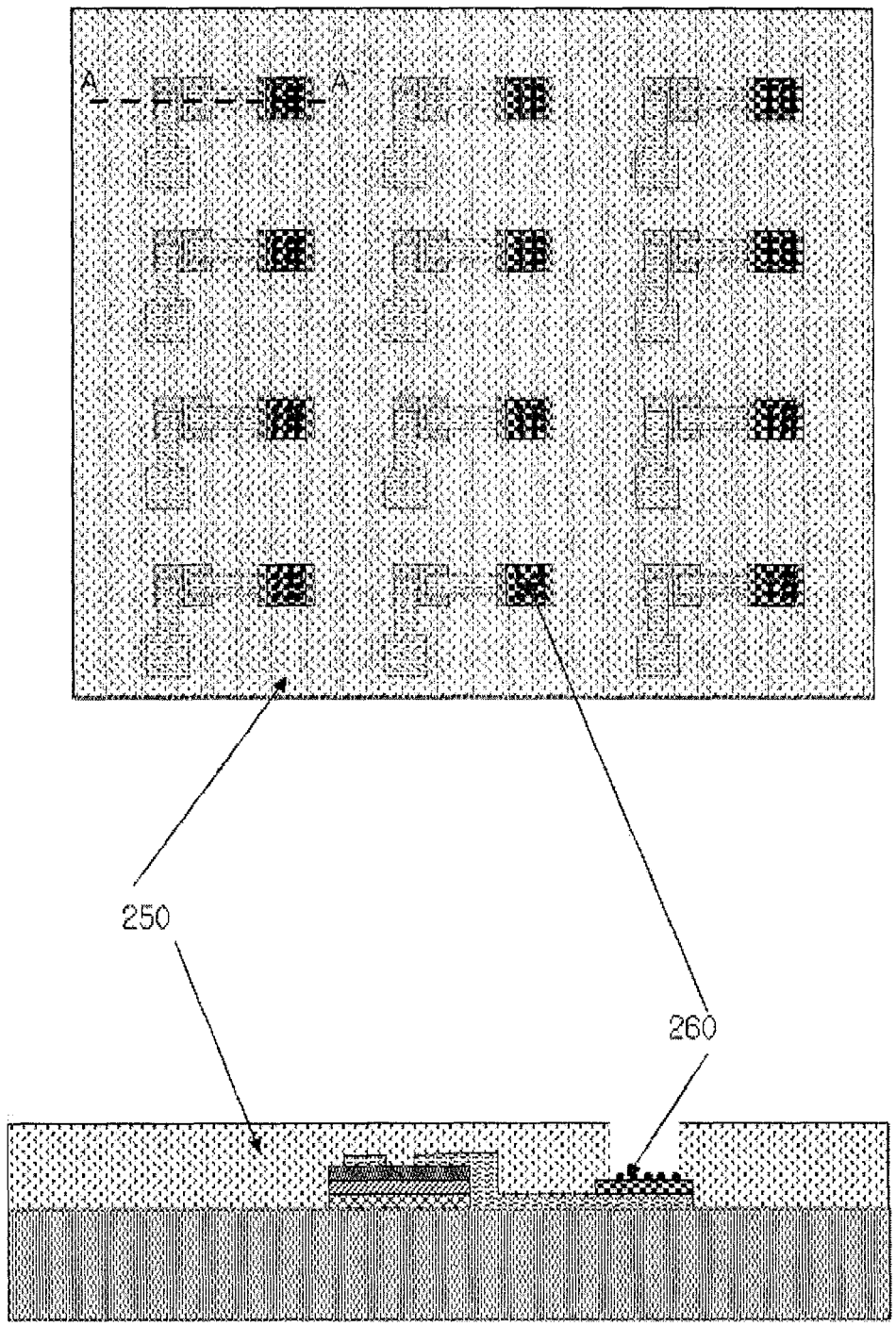

Referring to FIG. 21, after the self-assembled block copolymer thin film is coated on the bottom electrode 240, a part of blocks are etched. In this manner, dot-like insulating nanoparticles 250 remain on the bottom electrode 240. The above-mentioned process of block copolymer coating/self-assemblage-etching is the same as described with reference FIG. 1. The bottom electrode becomes have a decreased contact area through the process. Further, such a process including coating a solution of block copolymer, followed by annealing and etching may be applied effectively to an integrated memory device. In addition, when the block copolymer is etched, the first insulating layer 250 functions as an etch mask layer. According to an embodiment, the insulating nanoparticles provided on the bottom electrode 240 are silicon oxide nanoparticles that are inorganic oxides formed from oxidized polydimethylsiloxane. Therefore, polystyrene-polydimethylsiloxane copolymer is used as a block copolymer coated on the electrode, wherein polystyrene is removed by oxygen plasma, and thus only dot-like silicon oxide nanoparticles remain on the bottom electrode. Since such inorganic oxides have excellent mechanical properties and chemical resistance, it is possible to obtain a phase-change memory device having high stability and durability.

Figure 22:
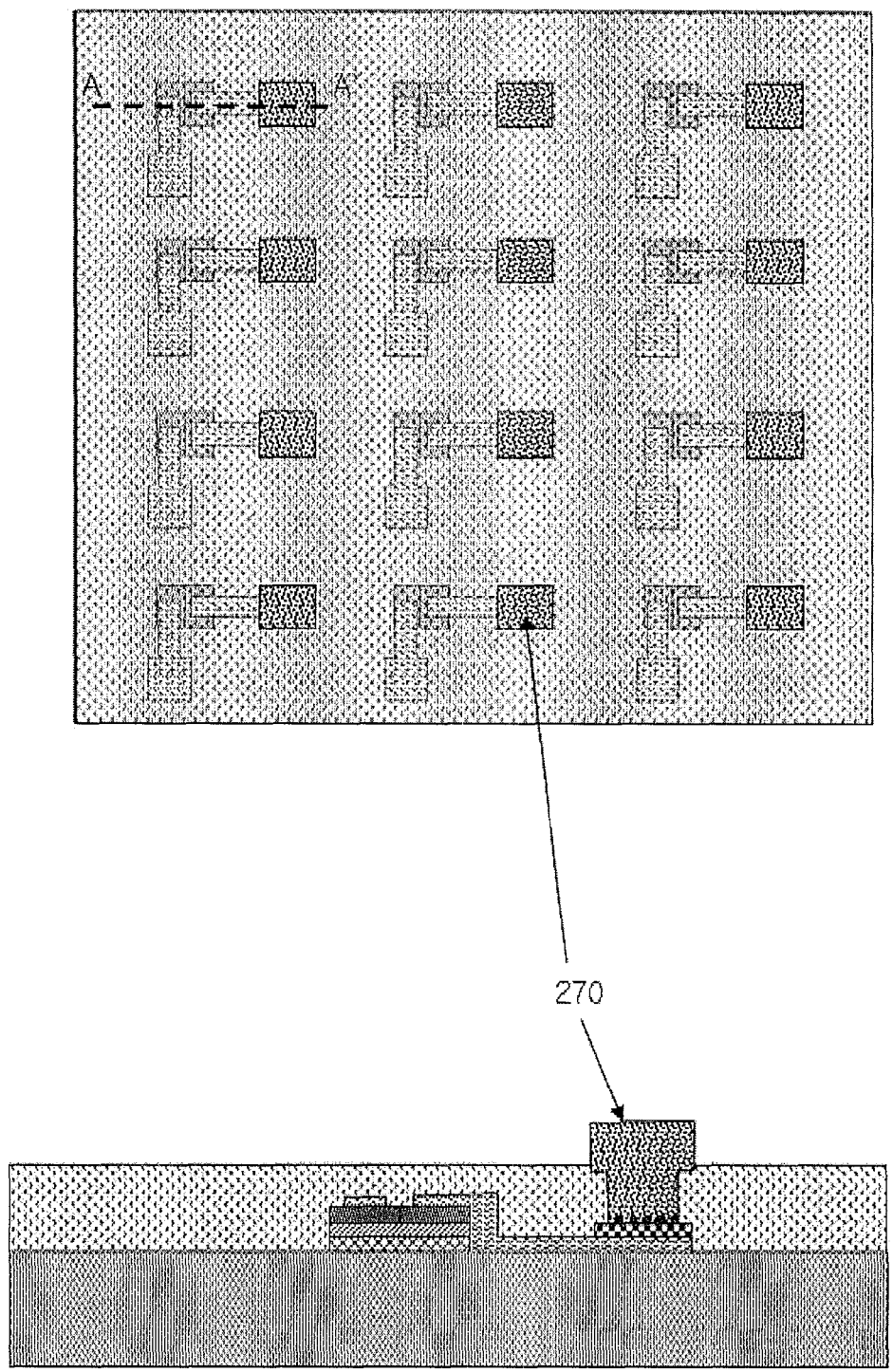

Referring to FIG. 22, a phase-change layer 270 is stacked on the bottom electrode 240 and the insulating nanoparticles 260. According to an embodiment, the phase-change material is a calcogenide compound (Ge—Sb—Te: GST) including germanium (Ge), antimony (Sb) and tellurium (Te). The phase-change memory device disclosed herein uses crystalline states of a phase-change material, and stores information in such a manner that it detects signal 1 and 0 when the phase-change material is in a crystalline state and amorphous state, respectively.

Particularly, according to an embodiment, the insulating nanoparticles obtained by carrying out self-assemblage of the block copolymer thin film, followed by patterning, are provided between the phase-change layer 270 and the bottom electrode 240. In this manner, it is possible to minimize the contact area between the phase-change material and the electrode, thereby inducing a decrease in RESET current.

Figure 23:
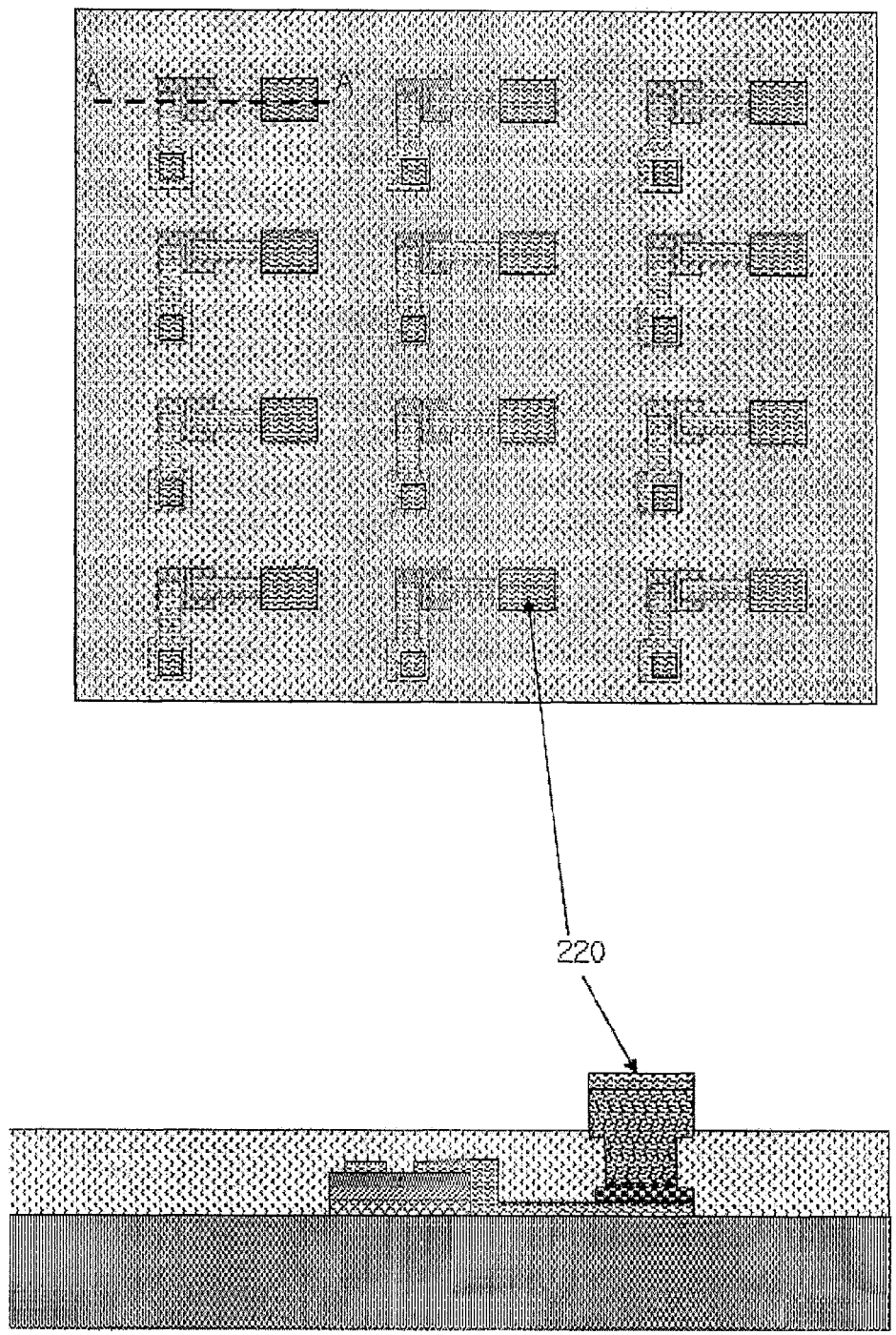

Referring to FIG. 23, another electrode 220 is stacked on the phase-change layer 270. This, two electrodes are disposed with the phase-change layer 270 interposed therebetween. Particularly, heat generated from the bottom electrode having higher resistance causes a change in crystal type of the phase-change layer 270.

Figure 24:
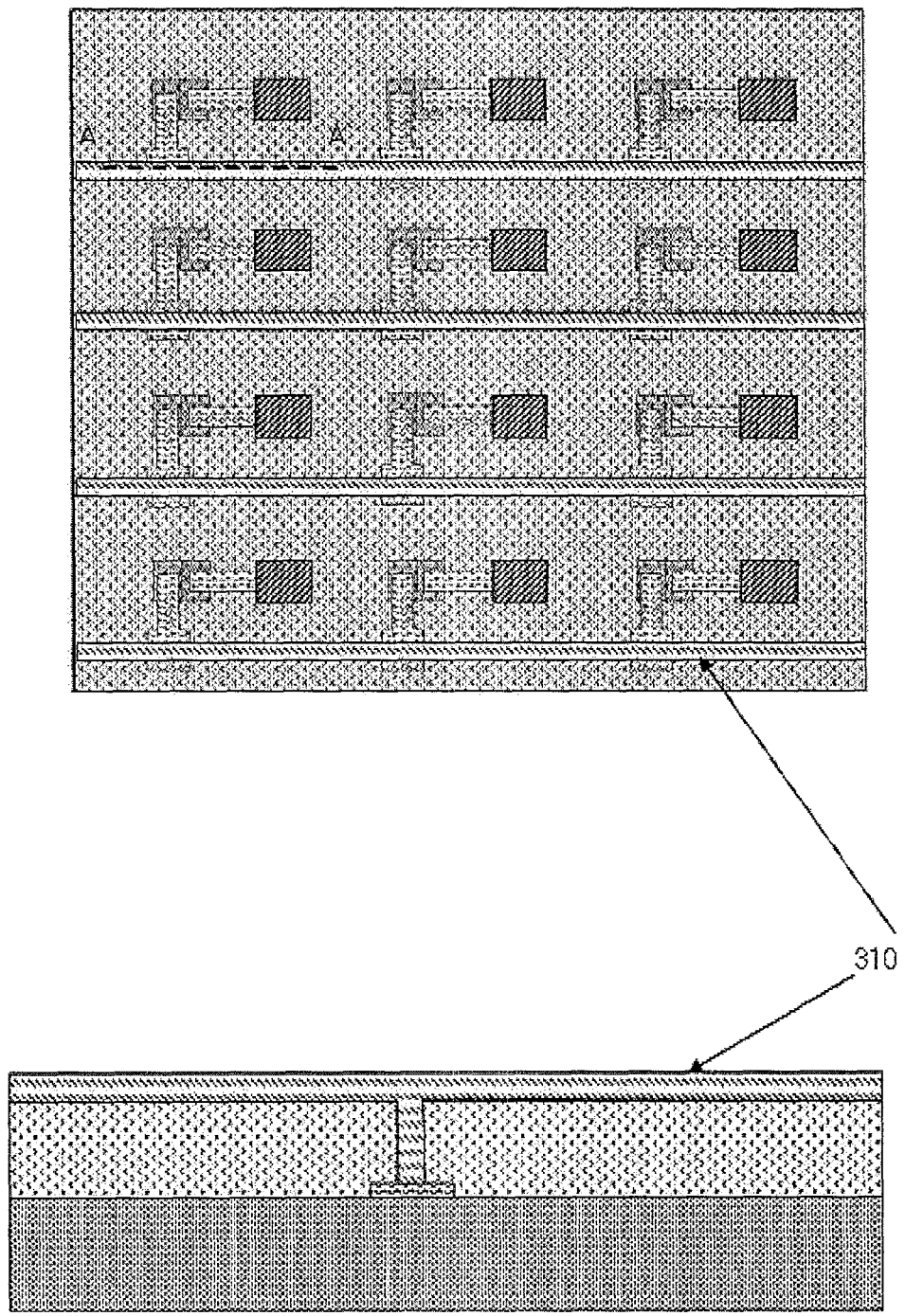

Referring to FIG. 24, a word-line 310 is connected to the electrode of the memory device having no phase-change layer 270 coated thereon. The word-line 310 is formed by patterning the first insulating layer, followed by deposition and patterning of a metal layer.

Figure 25:
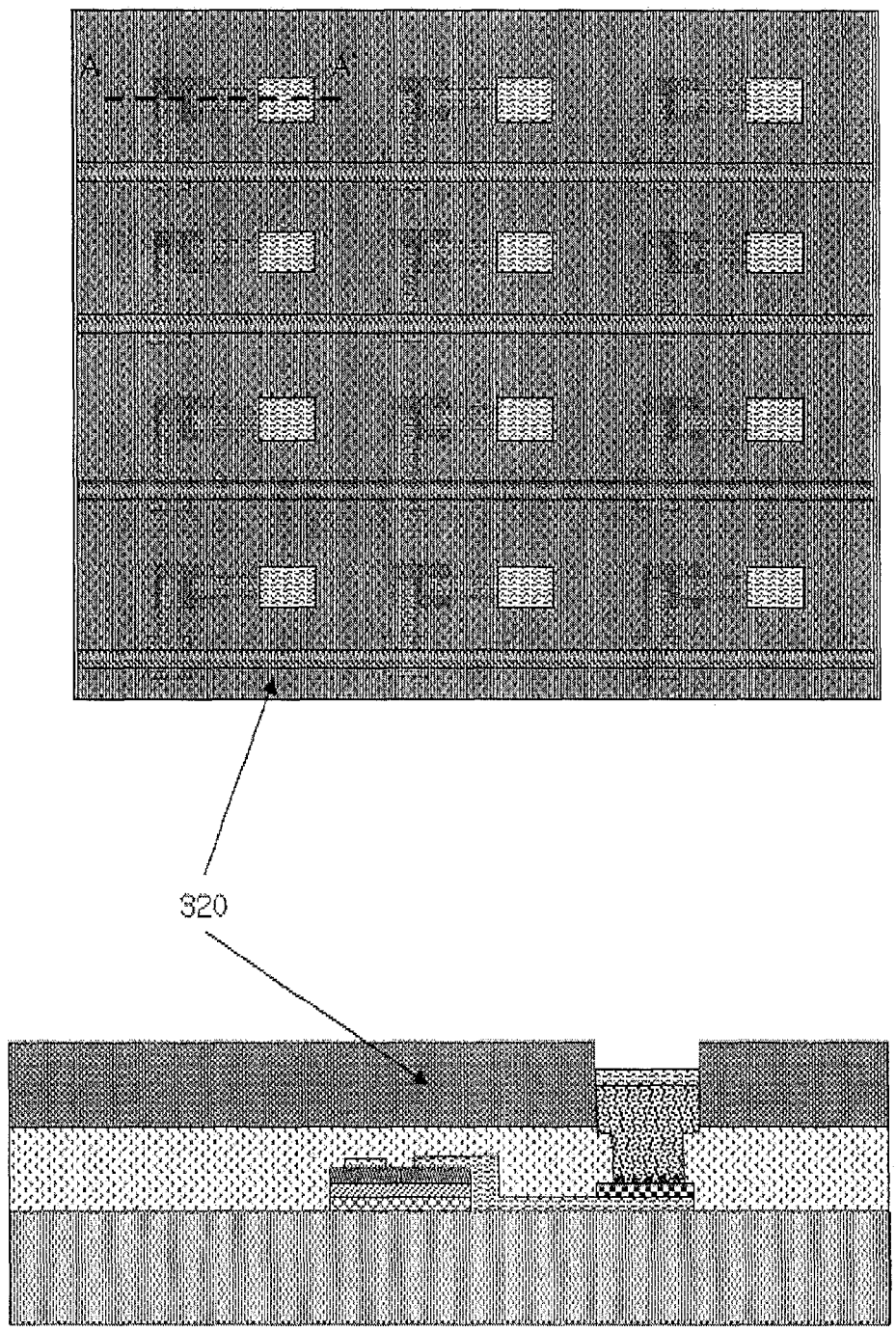

Referring to FIG. 25, a second insulating layer 320 is deposited on the substrate, followed by patterning. Thus, the phase-change layer connected to the bit-line (more particularly, a second metal adhesive layer 231) is exposed to the exterior.

Figure 26:
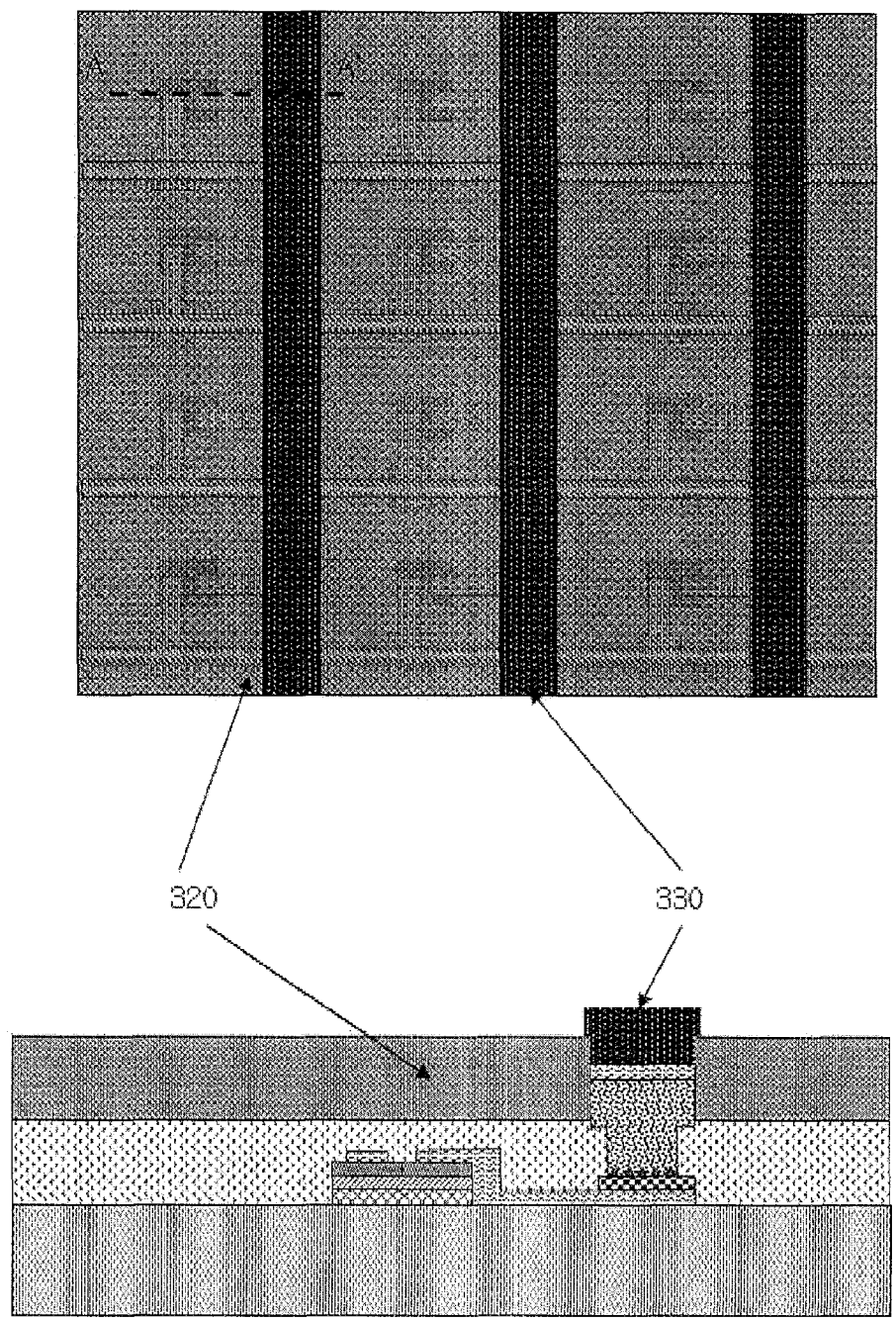

Referring to FIG. 26, the bit-line 330 is connected to the second metal adhesive layer 230.

Figure 27:
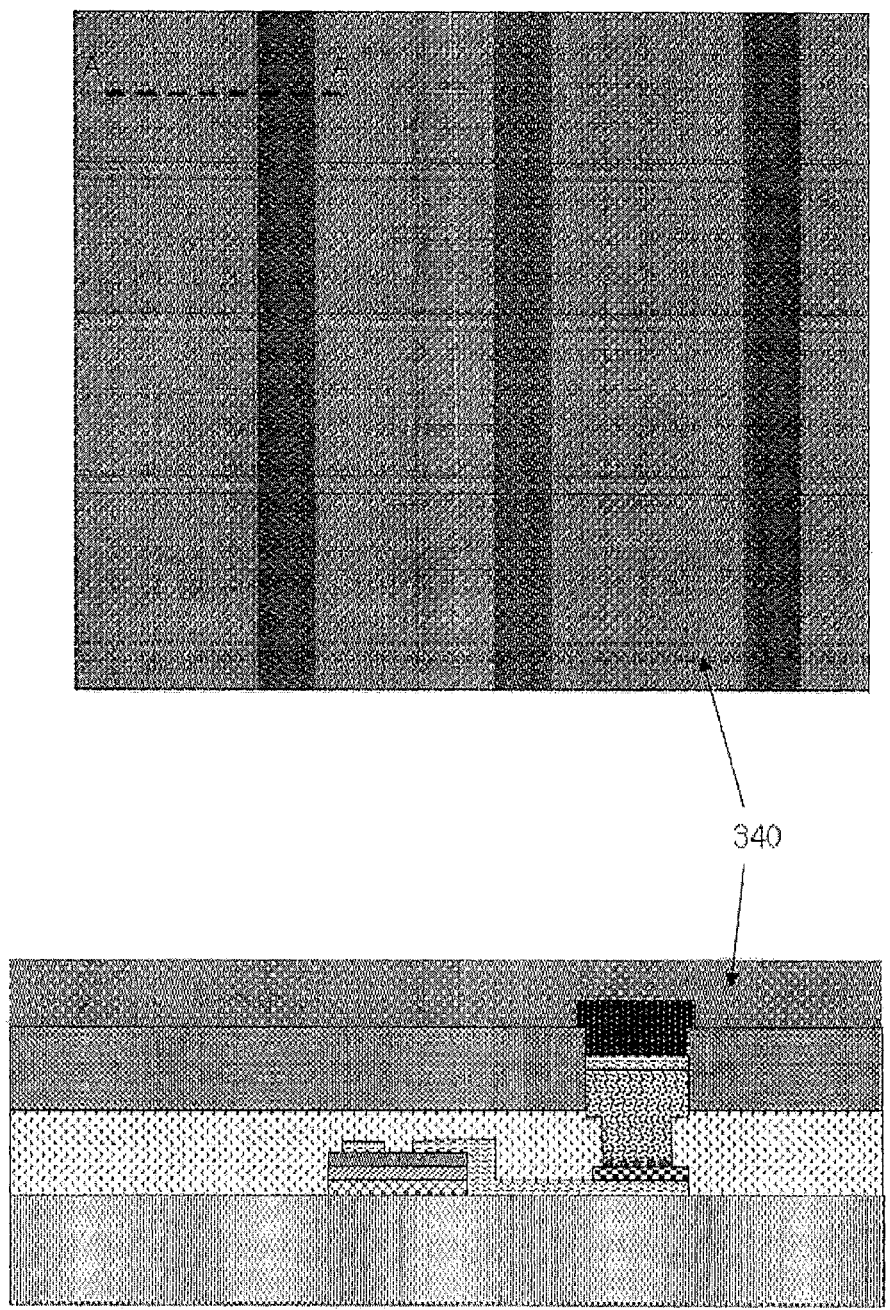

Referring to FIG. 27, a third insulating layer 340 is stacked on the device substrate, thereby covering the bit-line 330. Thus, a phase-change memory device capable of storing information depending on crystal states of a phase-change material is finished. As described above, the finished phase-change memory device uses a block copolymer mask capable of self-assemblage and selective patterning to reduce and control contact area between an electrode and a phase-change material. Therefore, it is possible to realize a phase-change memory device having lower RESET current as compared to phase-change memory devices according to the related art.

Figure 28:
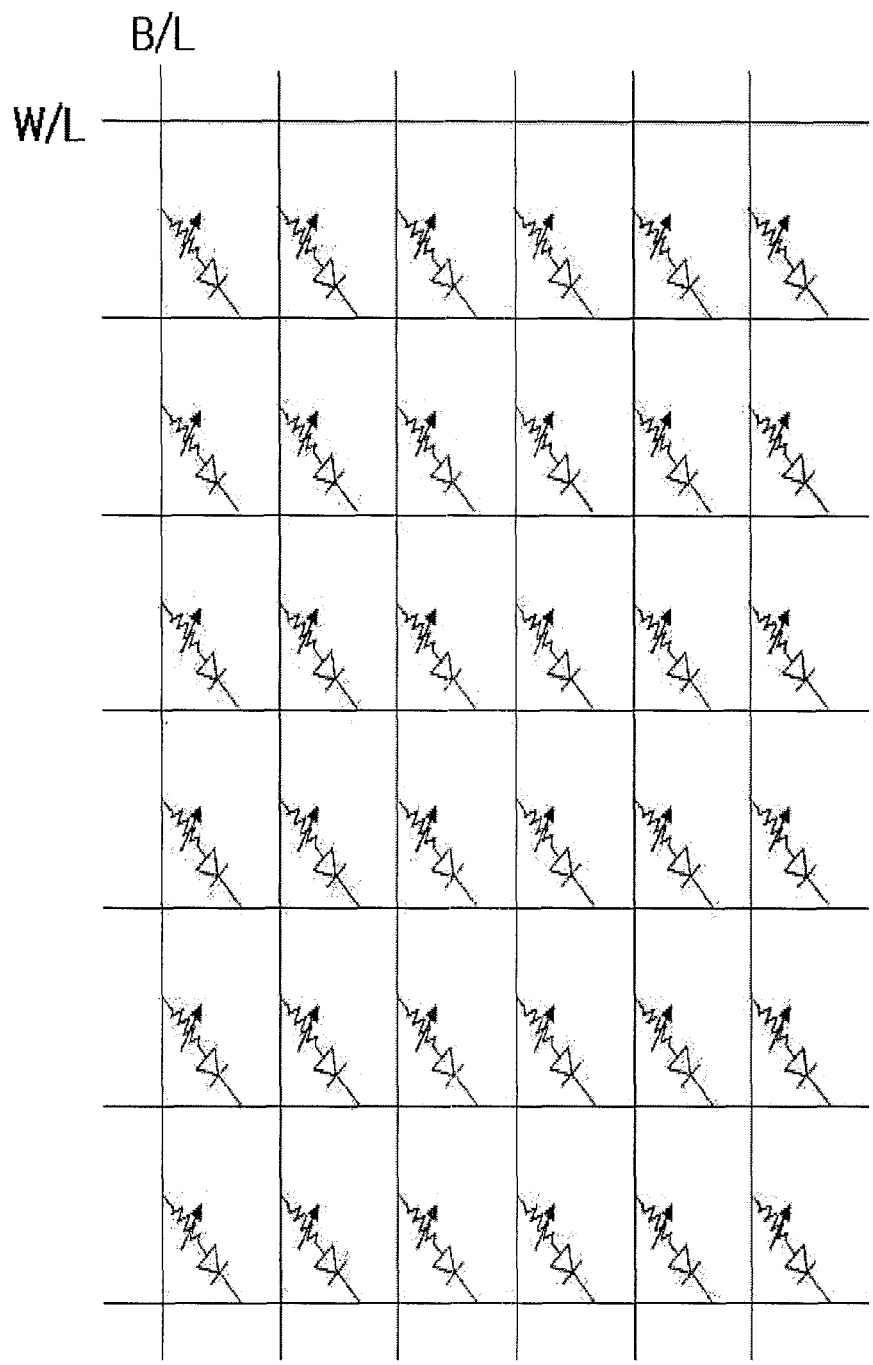
FIG. 28 is a circuit diagram of the phase-change memory device according to an embodiment.

FIG. 28 is a circuit diagram of the phase-change memory device according to an embodiment.

Figure 29:
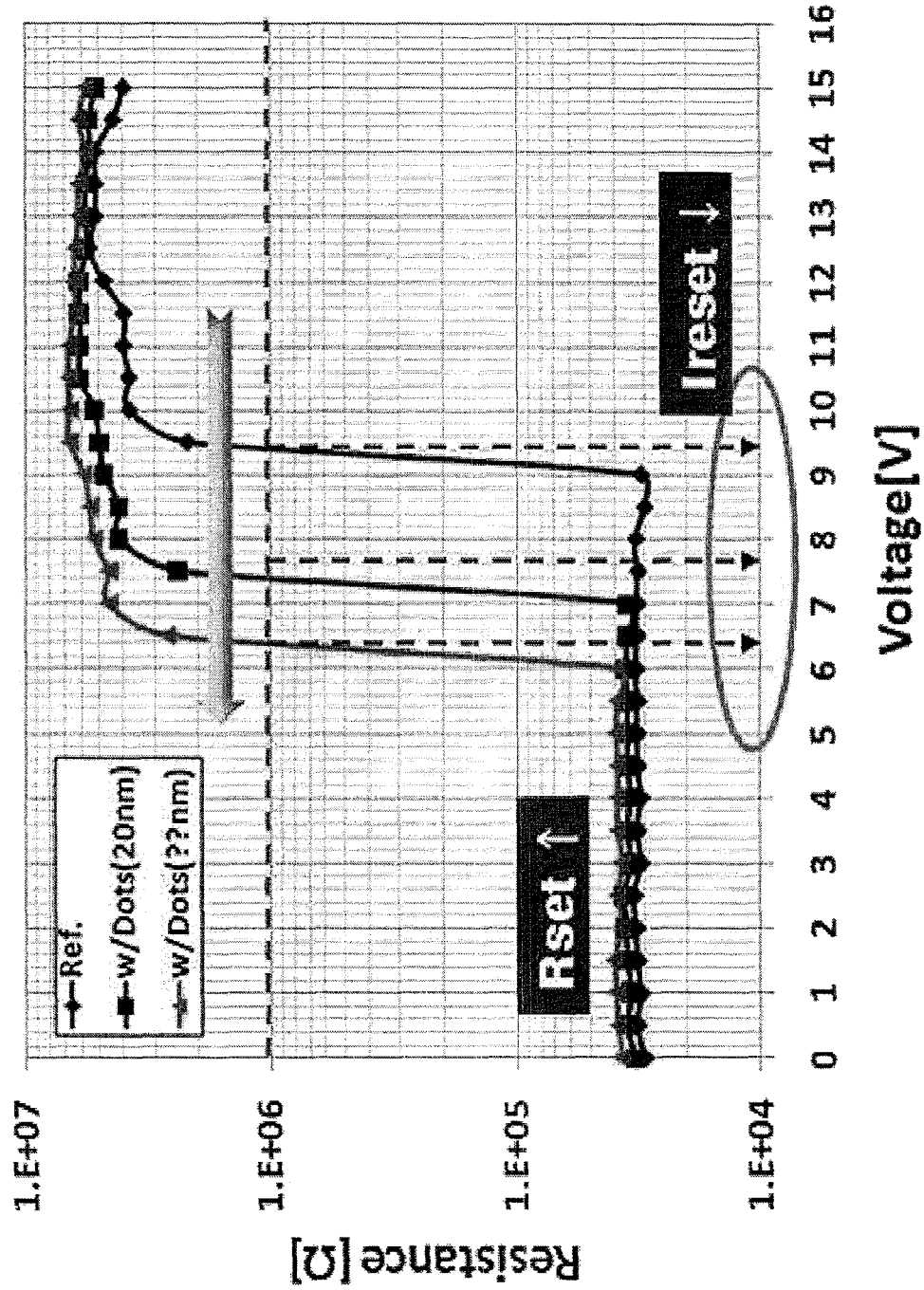
FIG. 29 is a RESET current-RESET resistance curve of a phase-change memory device.
Figure 30:
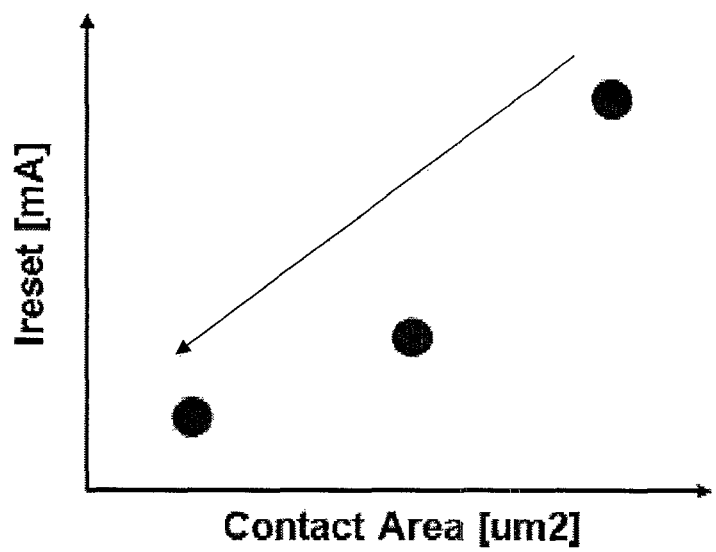
FIG. 30 is a curve illustrating a decrease in RESET current caused by a decrease in contact area.
Figure 30:
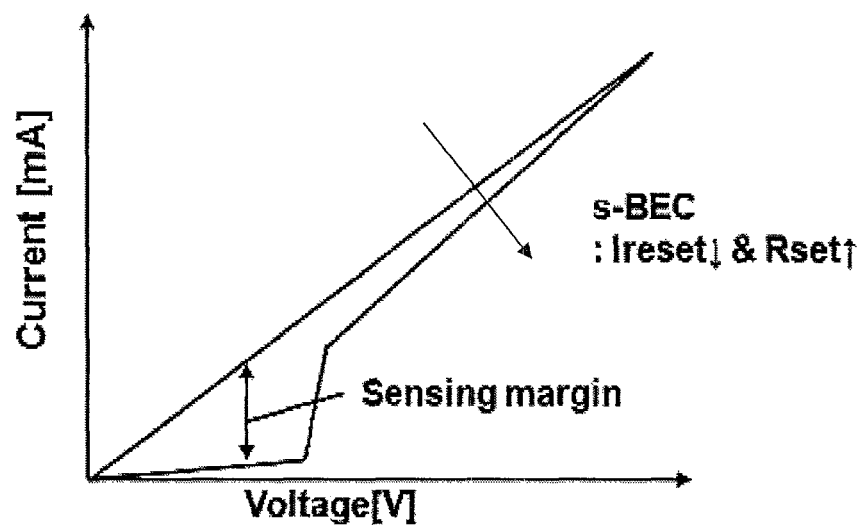

FIG. 29 is a RESET current-RESET resistance curve of a phase-change memory device, and FIG. 30 is a curve illustrating a decrease in RESET current caused by a decrease in contact area.

Referring to FIG. 29 and FIG. 30, a patterned block copolymer is provided between a phase-change layer and a bottom electrode to reduce contact area. As a result, it can be seen that RESET current decreases and RESET resistance increases.

Figure 31:
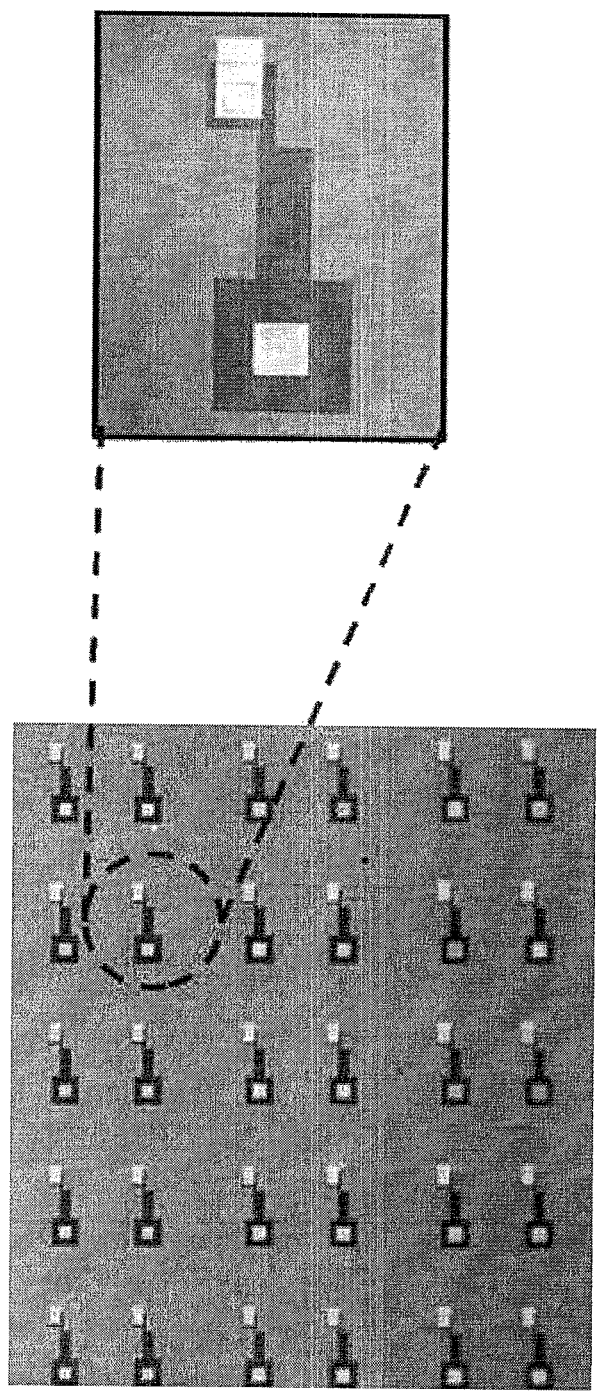
FIG. 31 is an optical microscopic view of a phase-change memory device obtained according to an embodiment.
Figure 32:
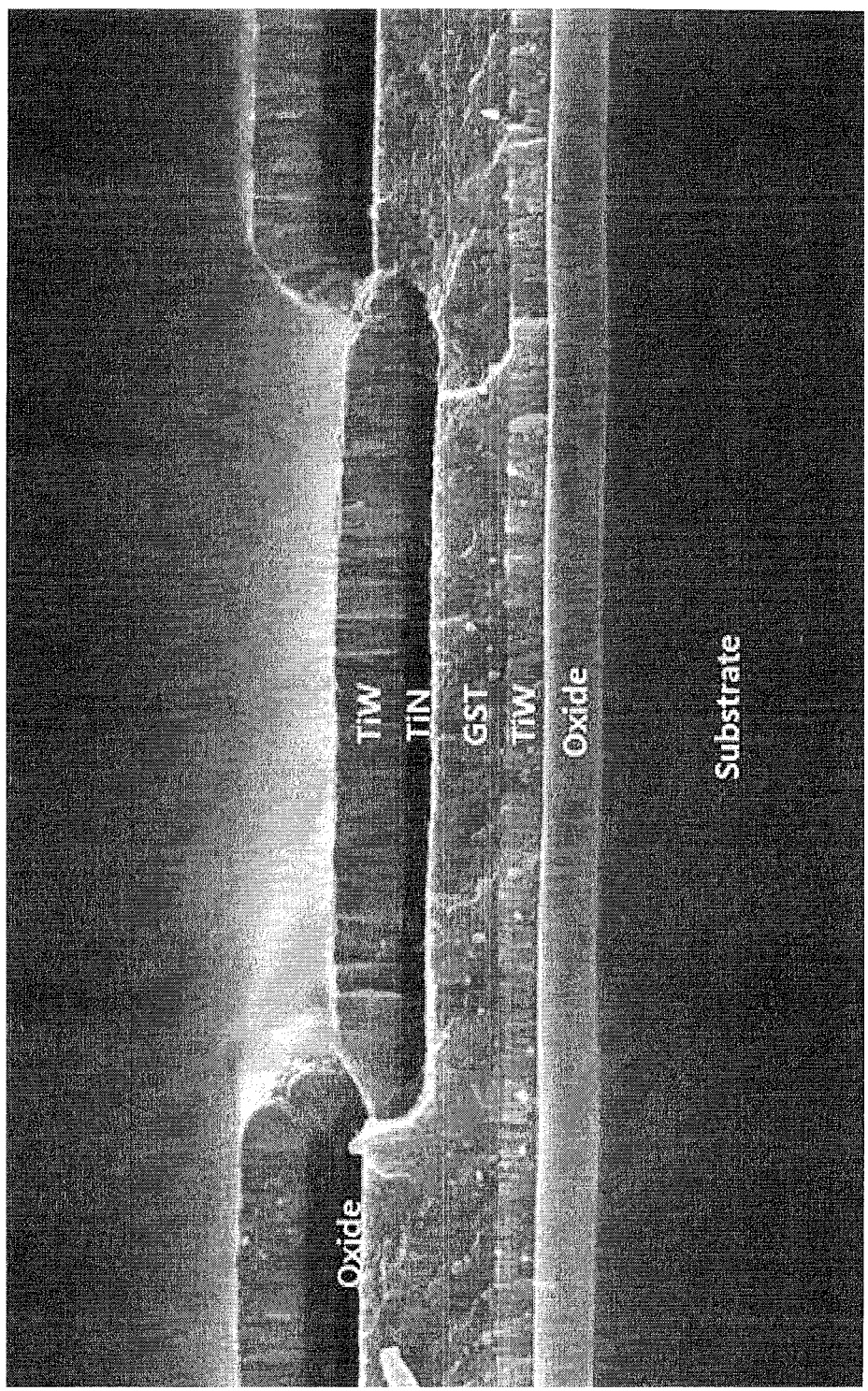
FIG. 32 is a sectional view of a device taken by scanning electron microscopy (SEM)
Figure 33A:
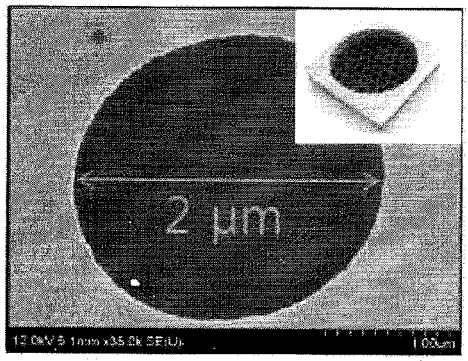
FIG. 33 is an SEM image of self-assembled particles.
Figure 33B:
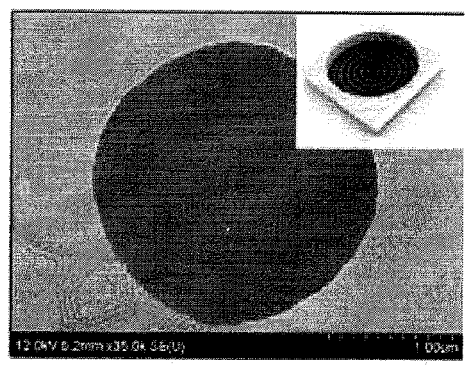
Figure 33C:
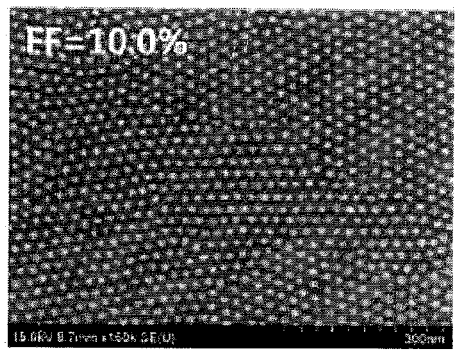
Figure 33D:
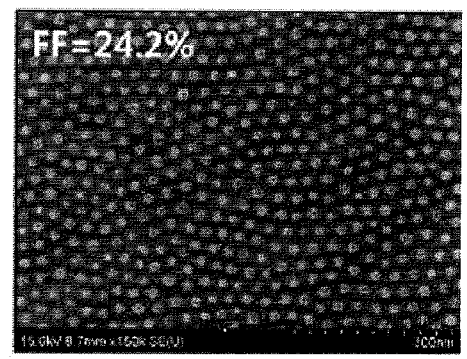
Figure 33E:
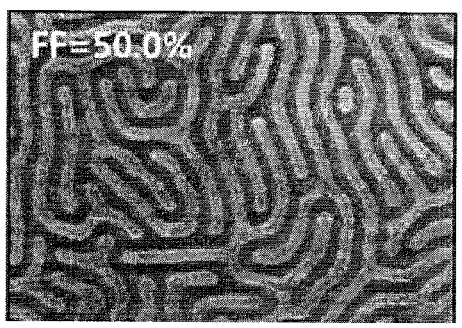
Figure 33F:
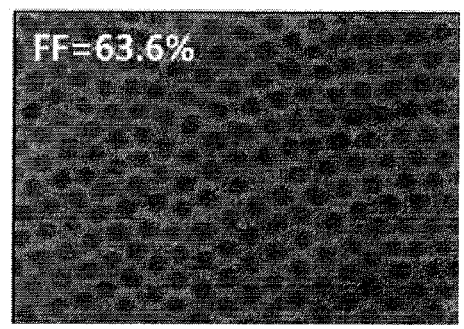

FIG. 31 is an optical microscopic view of a phase-change memory device obtained according to an embodiment, and FIG. 32 is a sectional view of a device taken by scanning electron microscopy (SEM). Further, FIG. 33 is an SEM image of self-assembled particles In FIG. 33, portion a shows spherical self-assembled particles formed well on the surface of GST inside a hole with a diameter of 2 μm. Portion b shows linear self-assembled particles. Portions c-f show magnified views of self-assembled particles. More particularly, portion c shows a magnified view of self-assembled particles having a small spherical shape (diameter: 11 nm), portion d is a magnified view of self-assembled particles having a large spherical shape (diameter: 18 nm). Portion e shows a magnified view of linear self-assembled particles, and portion f shows a magnified view of reverse spherical (opened) self-assembled particles.

Figure 34:
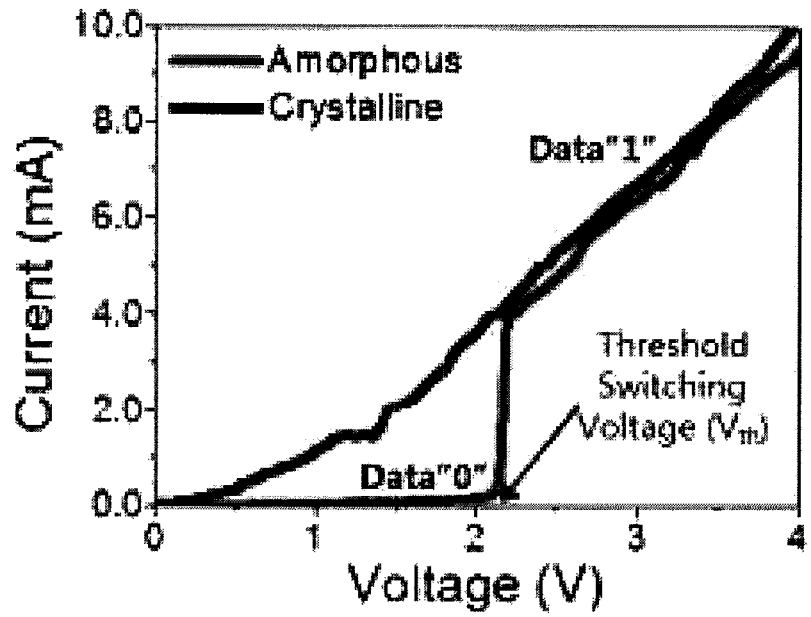
FIG. 34 shows graphs illustrating the results of analysis of a phase-change memory device according to an embodiment as compared with a conventional phase-change memory device.
Figure 34:
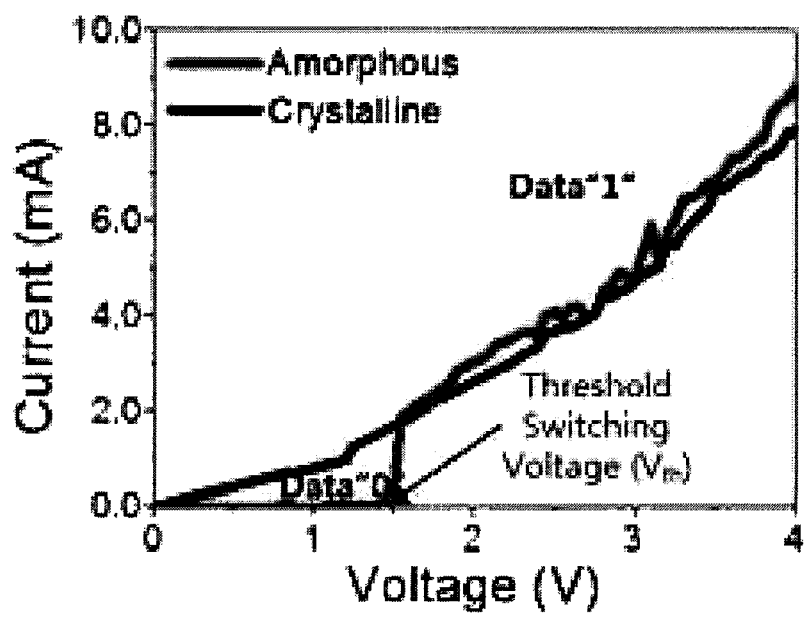
Figure 34C:
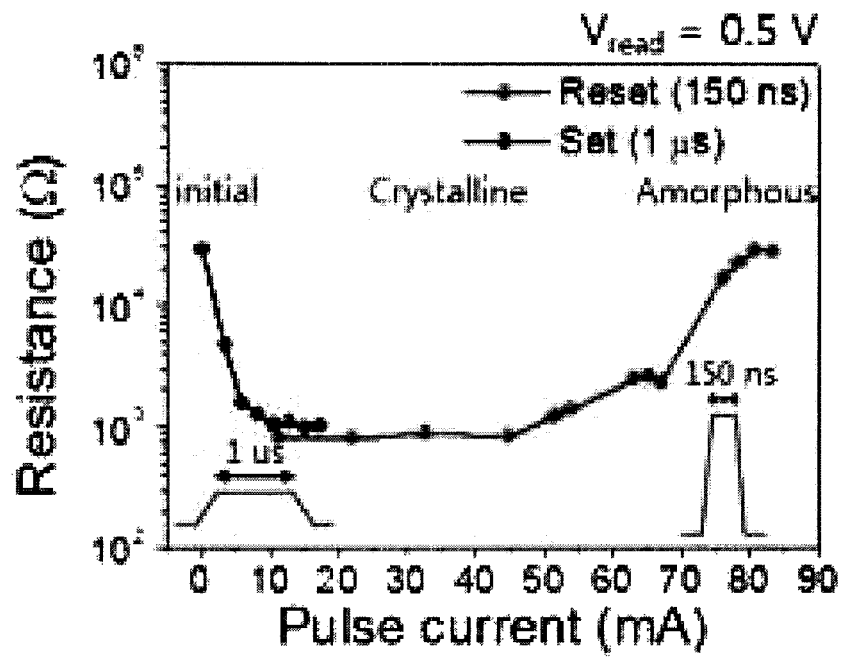
Figure 34D:
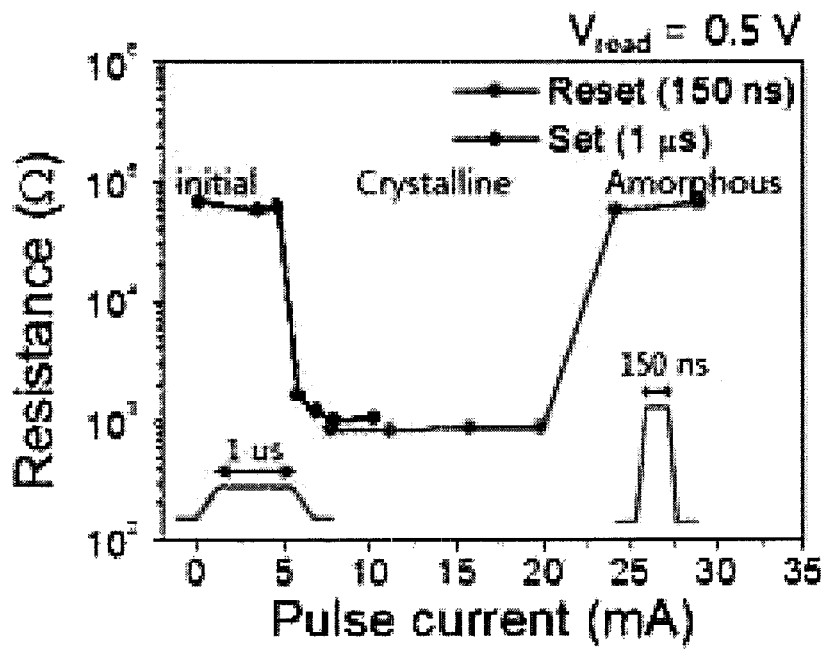
Figure 34E:
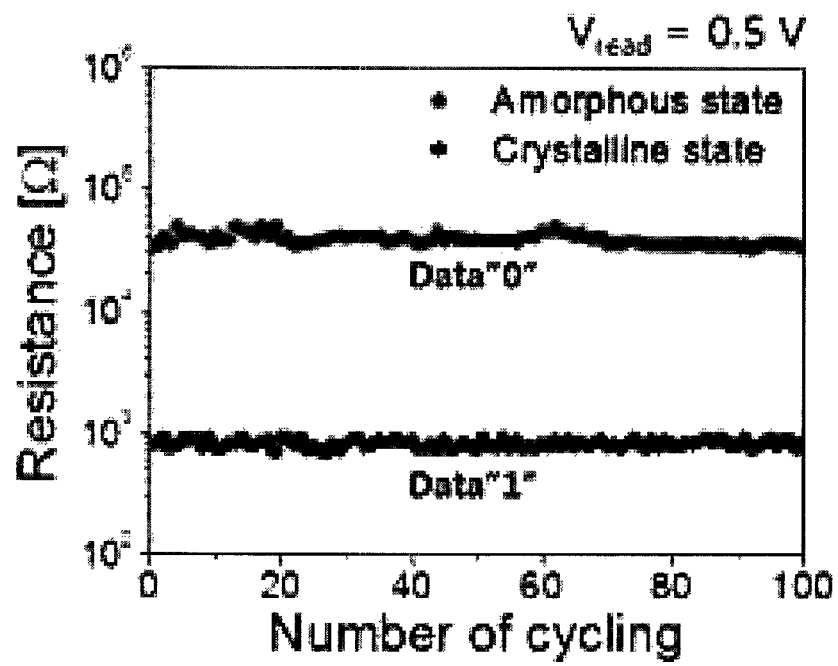
Figure 34F:
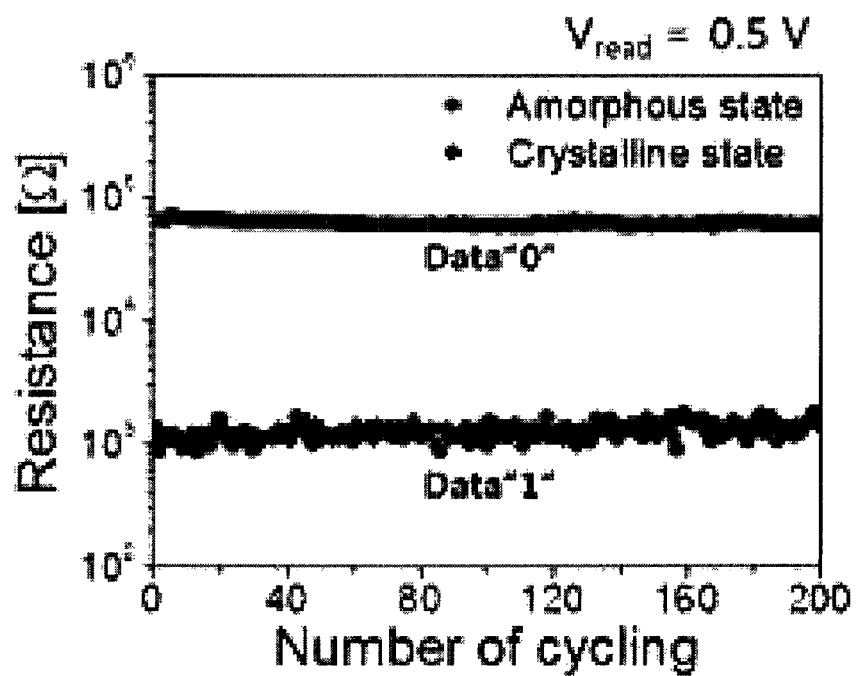

FIG. 34 shows graphs illustrating the results of analysis of a phase-change memory device according to an embodiment as compared with a conventional phase-change memory device.

In FIG. 34, portions a, c and e show electrical properties of conventional phase-change memory using no self-assembled particles, while portions b, d and f show electrical properties of phase-change memory using self-assembled particles. Portion a is a current-voltage curve of conventional phase-change memory having a contact area of 2 μm. Portion b is a current-voltage curve of phase-change memory having a contact area reduced by 50% with the aid of self-assembled particles. The conventional phase-change memory undergoes a phase change from an amorphous state to a crystalline state at 2.2V, while the phase-change memory using self-assembled particles undergoes a phase change from an amorphous state to a crystalline state at 1.5V. Portion c shows a resistance-current curve of conventional phase-change memory and portion d shows a resistance-current curve of phase-change memory using self-assembled particles.

Based on the results, it can be seen that when the initial state is an amorphous state, it is changed into a crystalline state by applying a long pulse voltage of 1 μs (SET). When the initial state is a crystalline state, it is changed into an amorphous state by applying a short pulse voltage of 150 ns (RESET). At that time, the resistance is extracted through a current value at 0.5V. In conventional phase-change memory, a current value of 75 mA and a current value of 10 mA are required to perform RESET (crystalline→amorphous) and SET (amorphous→crystalline), respectively. On the contrary, in the case of phase-memory using self-assembled particles according to an embodiment, RESET current is 24 mA and SET current is 5 mA. Thus, both RESET current and SET current are lowered. That is, RESET current decreases to about a third of 75 mA by a decrease in contact area of 50%.

Portion e is a graph showing the results after repeating SET/RESET in a number of 100 cycles in the conventional phase-change memory. Portion e is a graph showing the results after repeating SET/RESET in a number of 200 cycles in the phase-change memory using self-assembled particles. It can be seen from the results that use of self-assembled particles does not adversely affect cycling characteristics.

Figure 35A:
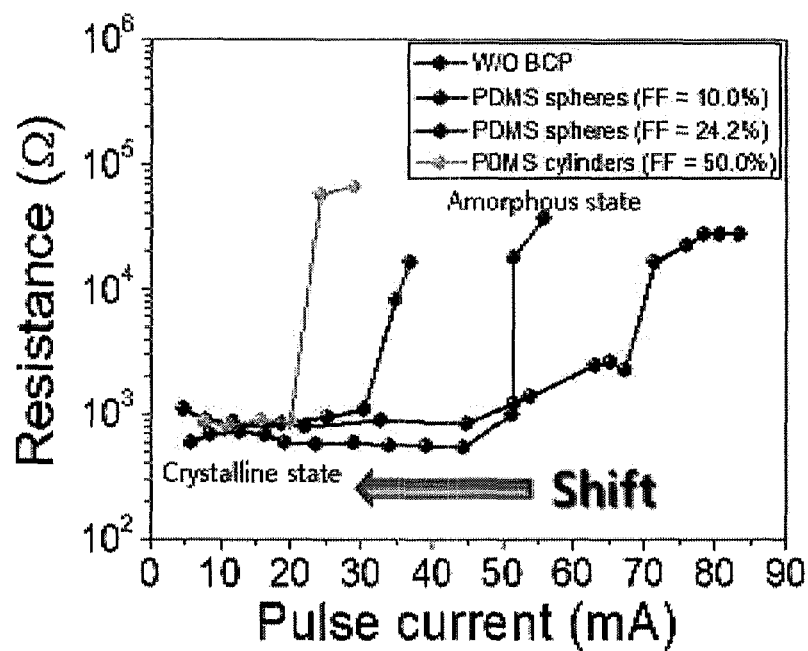
FIG. 35 shows graphs illustrating RESET current values as a function of contact area.
Figure 35B:
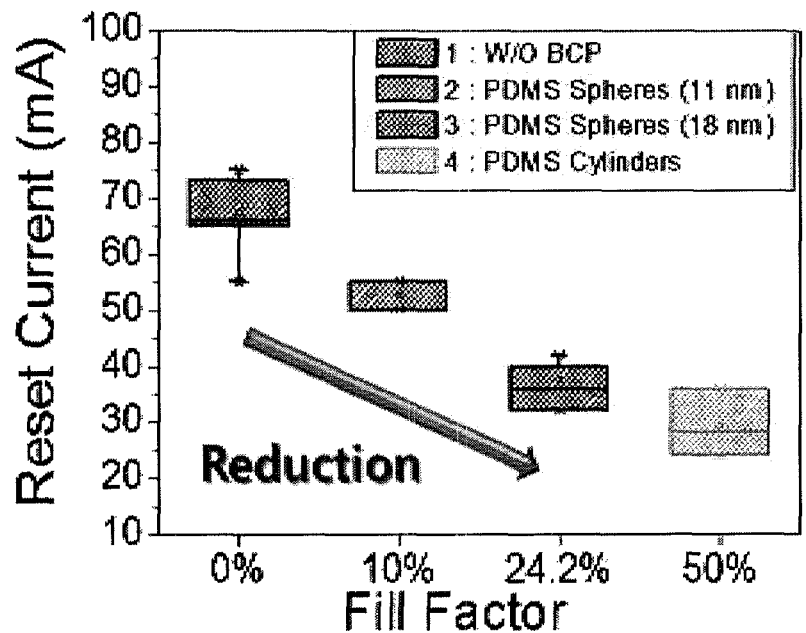

FIG. 35 shows graphs illustrating RESET current values as a function of contact area.

Referring to FIG. 35, it can be seen that RESET current decreases as the contact area is reduced to 10%, 24.2% and 50.0%. Portion a shows resistance-current curves and exhibits a left shift of resistance-current curves. In other words, while the contact area decreases to 50%, RESET current required for a change from a crystalline state to an amorphous state tends to decrease gradually. Portion b is a graph illustrating a range of RESET current values observed from several samples of each type of memory. Similarly to portion a, the graph of portion b has a tendency for RESET current decreases as the contact area decreases.

In still another aspect, there are provided a method and a structure by which memory devices, such as RRAM, PRAM, DRAM, etc., are realized on a flexible substrate.

According to an embodiment, a high-temperature process for fabricating a silicon device is carried out on a bulk SOI sacrificial substrate, and then the switching device is transferred to a flexible plastic substrate. The transfer is carried out by performing vertical etching of the sacrificial substrate surround the region of the switching device, performing anisotropic etching, and transferring the switching device separated from the lower sacrificial substrate to the flexible substrate by way of a transfer substrate such as PDMS. Then, a constitutional element (ON-OFF element) capable of turning on/off the switching device is further formed on the transferred switching device. According to an embodiment, the memory device may be RRAM, DRAM or PRAM. Herein, in the case of RRAM, the ON-OFF element may be resistance memory; in the case of DRAM, it may be a capacitor; and in the case of PRAM, it may be phase-change memory. In addition, when the switching device is a transistor having a source-gate-drain region, the ON-OFF element may be stacked on the drain region. In this case, the transistor is in the form of a thin film (membrane) fabricated on a sacrificial substrate, followed by etching and peeling. Therefore, the flexible memory device obtained in the above manner is fabricated on a sacrificial substrate, and then transferred to a flexible substrate. After the transfer, the flexible memory device is further provided with an ON-OFF element capable of turning on/off the switching element.

In still another aspect, there is provided a method for manufacturing a flexible memory switching device. Particularly, amorphous silicon is deposited on a flexible substrate first, and then is crystallized to multicrystalline or monocrystalline silicon by using eximer laser crystallization, thereby realizing a high-performance silicon device on a flexible substrate.

Hereinafter, a method for manufacturing a memory device using RRAM will be explained for illustrative purposes.

However, the scope of this disclosure is not limited thereto and covers variants, such as a memory device using DRAM or PRAM.

According to an embodiment, there is provided a flexible RRAM device including an NOR type array having one transistor and one resistor (1T-1R) structure on a flexible substrate. Particularly, a high-efficiency flexible monocrystalline silicon transistor is integrated to an amorphous $TiO_2$ ($\alpha$-$TiO_2$)-basedbipole resistive memory device to control logic states of the memory. Unit cells of 1T-1R RRAM are connected with each other through word-, bit- and source-lines of 8×8 NOR type array to control each unit of memory cell independently. The flexibility of the device disclosed herein is tested through a bending test and the device is shown to have mechanical stability and reliability on a plastic substrate, as described hereinafter in more detail. As can be seen from such results, the flexible device disclosed herein shows applicability as a novel non-volatile memory device.

FIG. 36 to FIG. 43 are schematic views showing sequential operations of the method for manufacturing an 8×8 matrix 1T-1R flexible RRAM structure on a plastic substrate according to an embodiment.

Referring to FIG. 36 to FIG. 43, a silicon nanomembrane patterned and doped on an SOI substrate is transferred from the SOI substrate to a polyimide substrate (Dupont, Kapton), wherein a spin-cast PI precursor (polyamic acid, Sigma Aldrich) is used as an adhesive layer.

Figure 36:
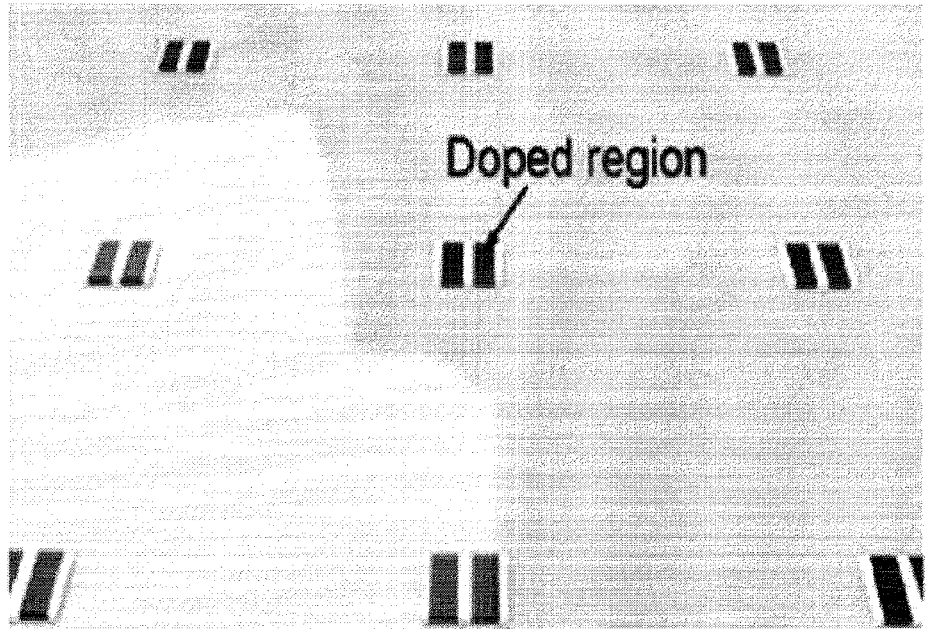
FIG. 36 to FIG. 43 are schematic views showing sequential operations of the method for manufacturing an 8×8 matrix one transistor-one resistor (1T-1R) flexible resistive random access memory (RRAM) structure on a plastic substrate according to an embodiment.
Figure 37:
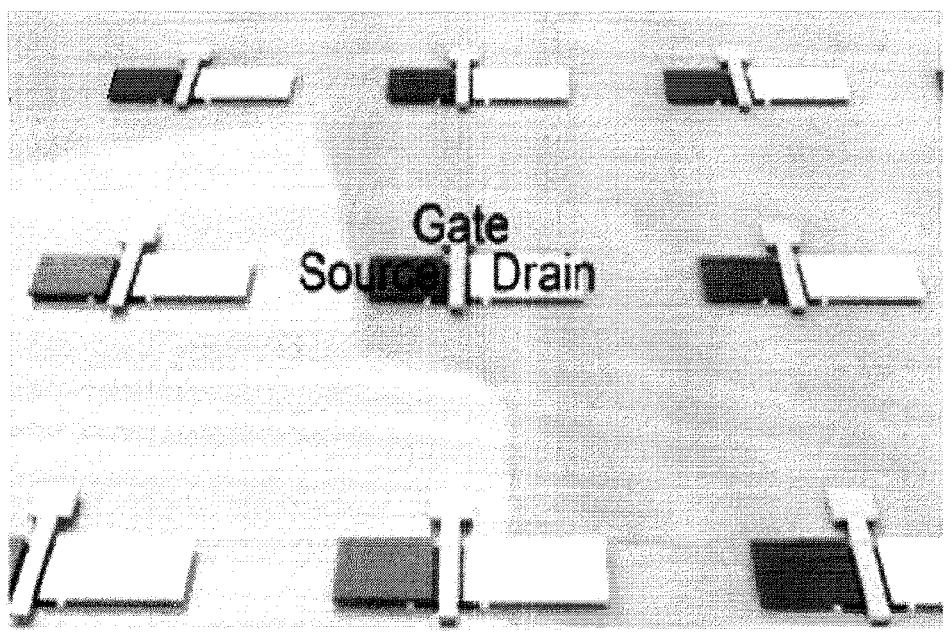
Figure 38:
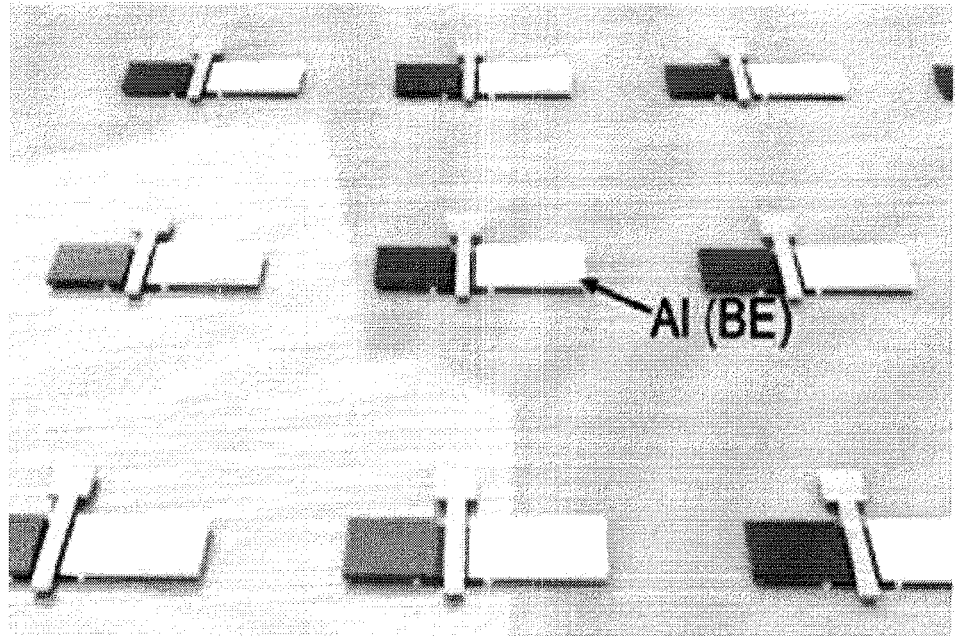
Figure 39:
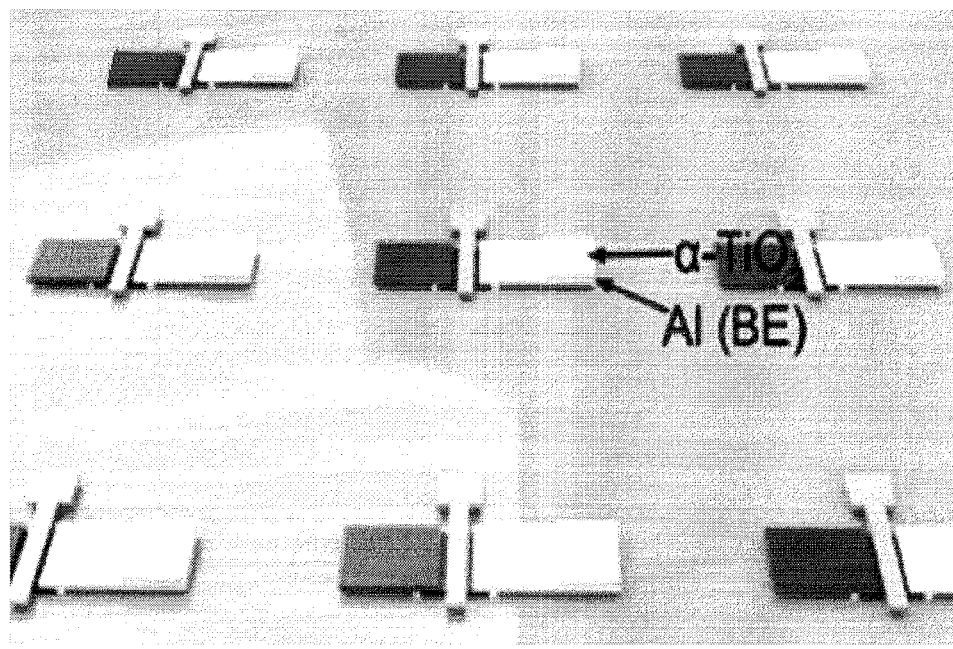
Figure 40:
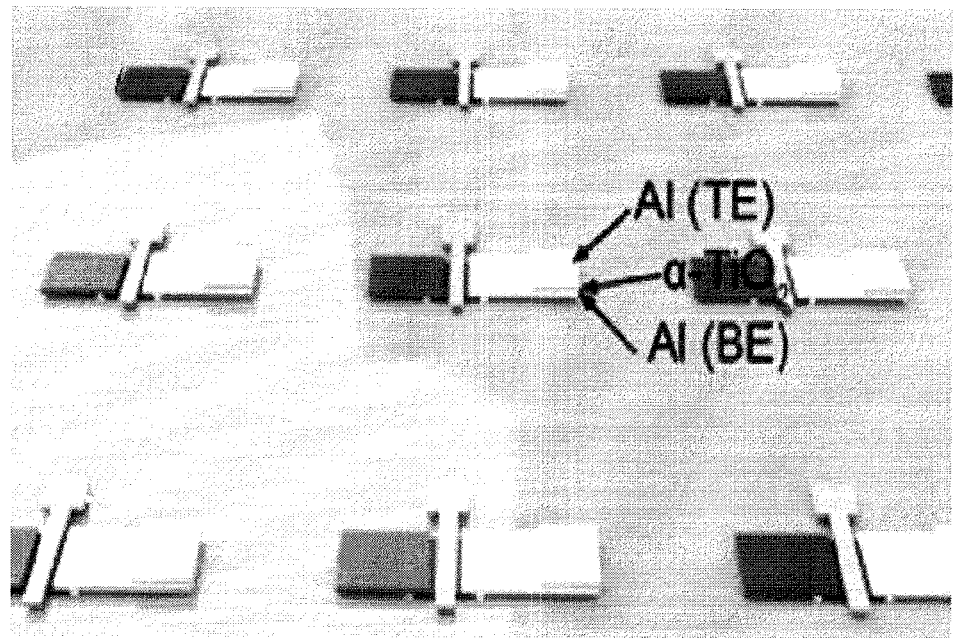

After the transfer, active regions of a transistor is isolated through photolithography and $SF_6$ plasma etching, and the PI precursor is cured at 250° C. under nitrogen atmosphere for 1 hour. $SiO_2$ as a gate dielectric is deposited by PECVD at 300° C. Source and drain contacts are patterned through lithography and buffered oxide etchant (BOE). Drain and gate electrodes formed of chrome/gold (10 nm/200 nm) are deposited through RF sputtering, and defined by photolithography and wet etching processes. After forming a switching transistor, an Al bottom electrode is deposited on the drain region through RF sputtering and lift-off processes (FIG. 36). An amorphous $TiO_2$ ($\alpha$-$TiO_2$) thin film is deposited at a substrate temperature of 100° C. by plasma-enhanced atomic layer deposition (PEALD, ASM Genitech MP-1000). The thin film has a thickness of ~14 nm after 270 cycles of processes. Titanium tetraisoproxide ($Ti(OCH(CH_3)_2)_4$; TTIP) and oxygen plasma are used as a Ti precursor and an oxygen source, respectively (FIG. 37). After deposing the $\alpha$-$TiO_2$ layer as a variable resistive layer, an Al top electrode is deposited in the same manner as the bottom electrode. Bit-, source- and word-lines formed of chrome/gold (10 nm/200 nm) are patterned continuously through RF sputtering and wet etching processes (FIG. 38). A spin-cast SU-8 layer is opened by photolithography to provide an interlayer dielectric between metal layers.

Figure 44:
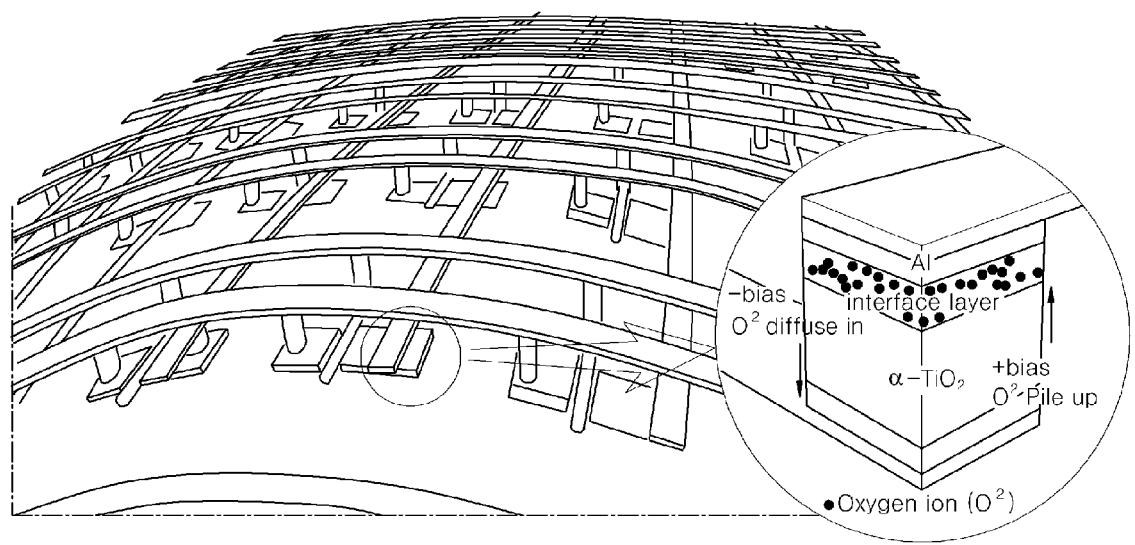
FIG. 44 is a schematic view illustrating the structure of an 8×8 matrix 1T-1R flexible RRAM on a plastic substrate according to an embodiment.

FIG. 44 is a schematic view illustrating the structure of an 8×8 matrix 1T-1R flexible resistive RRAM on a plastic substrate according to an embodiment.

Referring to FIG. 44, the resultant n-channel metal-oxide semiconductor field effect transistor (NMOSFET) has a channel length of 10 μm, a contact overlap (Lo) of 20 μm and a channel width of 200 μm. The doped silicon membrane (thickness: 100 nm) transferred from a silicon-on-insulator (SOI) wafer to a plastic substrate is used as an active layer of the transistor. In addition, an $\alpha$-$TiO_2$ layer is formed between the bottom electrode and the top electrode for resistive switching as an ON-OFF element of the memory device. Herein, the $\alpha$-$TiO_2$ layer is formed on a drain region. The whole memory cells are connected with each other through word-, bit- and source-lines of NOR type array.

Figure 45:
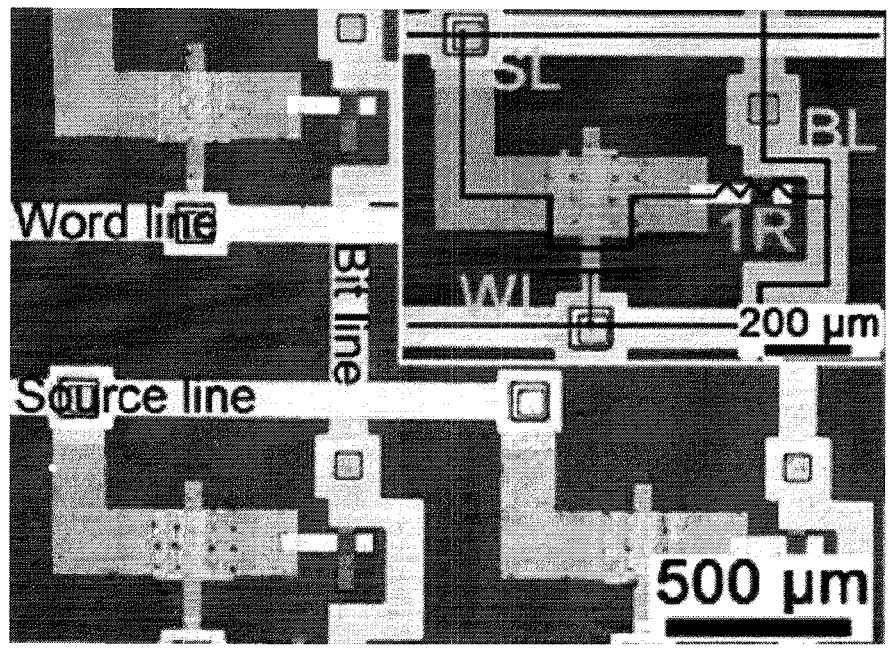
FIG. 45 is a magnified optical image of a 1T-1R array.

FIG. 45 is a magnified optical image of a 1T-1R array.

Referring to FIG. 45, a gate source electrode is connected to each of the word-line (WL) and the source-line (SL) to control the transistor, and an Al top electrode is connected to the bit-line (BL) to control the logic state of a memory unit cell. The integrated transistor functions to maintain the logic state of a memory cell when another cell is accessed.

Figure 46:
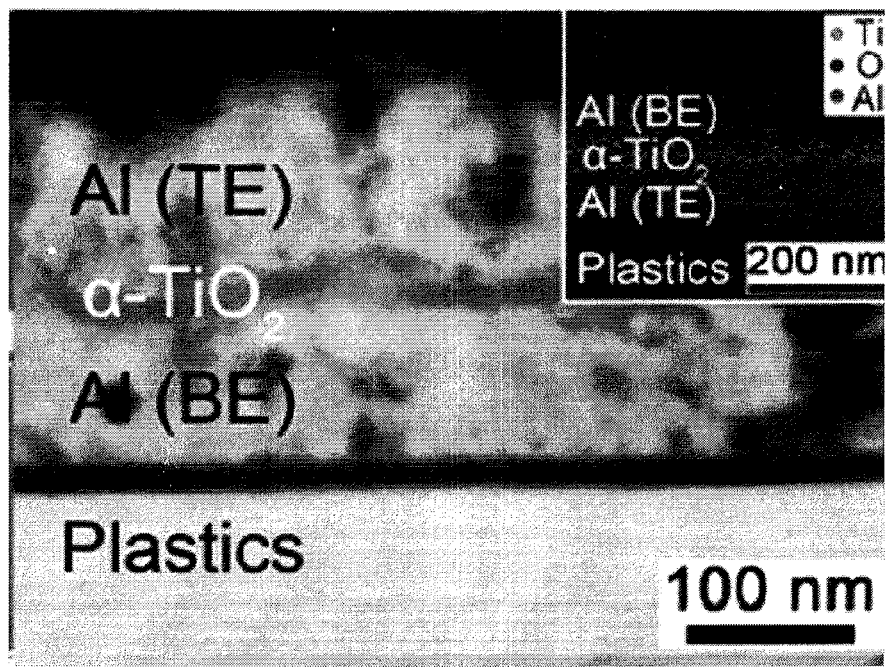
FIG. 46 is a bright field transmission electron microscopy (BFTEM) image of a flexible device formed on a plastic substrate according to an embodiment.

FIG. 46 is a bright field transmission electron microscopy (BFTEM) image of a flexible device formed on a plastic substrate according to an embodiment. Referring to FIG. 46, it can be seen that a metal-insulator-metal (MIM) layer (120 nm Al/14 nm $\alpha$-$TiO_2$/120 nm Al) with a uniform height is formed on the substrate. It can be also seen from the inserted figure that a titanium oxide layer is interposed between the two aluminum electrodes.

Figure 47:
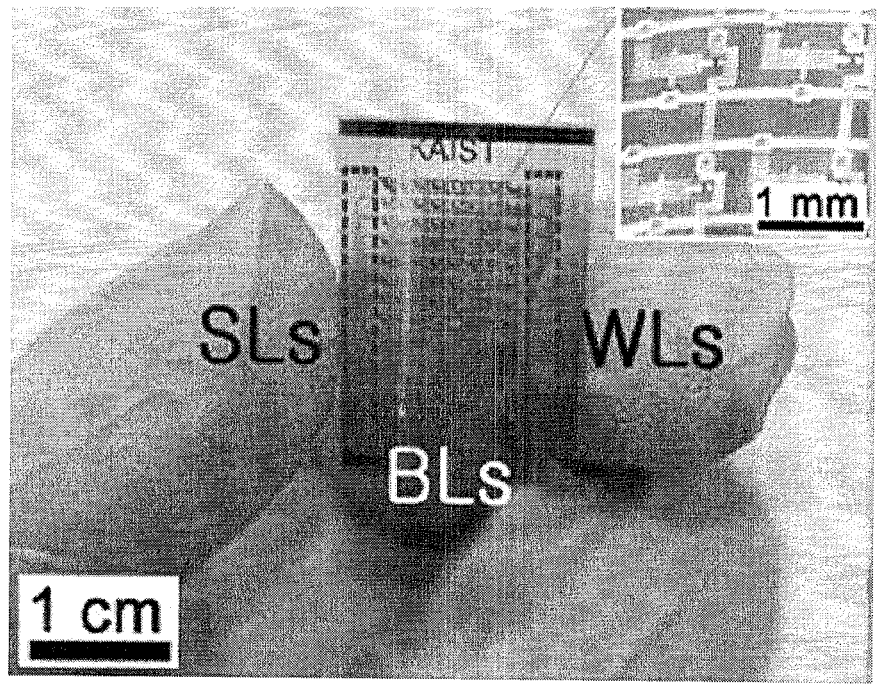
FIG. 47 and FIG. 48 are photos showing a uniform contact area provided on a curved surface by a flexible RRAM according to an embodiment.

FIG. 47 shows a flexible 1T-1R RRAM device disclosed herein and a magnified view thereof.

Referring to FIG. 47, the flexible RRAM disclosed herein represents an NOR type 8×8 memory cell matrix, and has an active region on a polyimide film having a thickness of 25 μm, the active region having an area of 1×1 $cm^2$. The metal (Au pad) is connected to WL, BL and SL so that each 1T-1R memory unit cell is accessed. The inserted figure is a magnified view of 4 memory unit cells. It is shown that the memory device disclosed herein has mechanical stability even when it is in a bent form.

Figure 48:
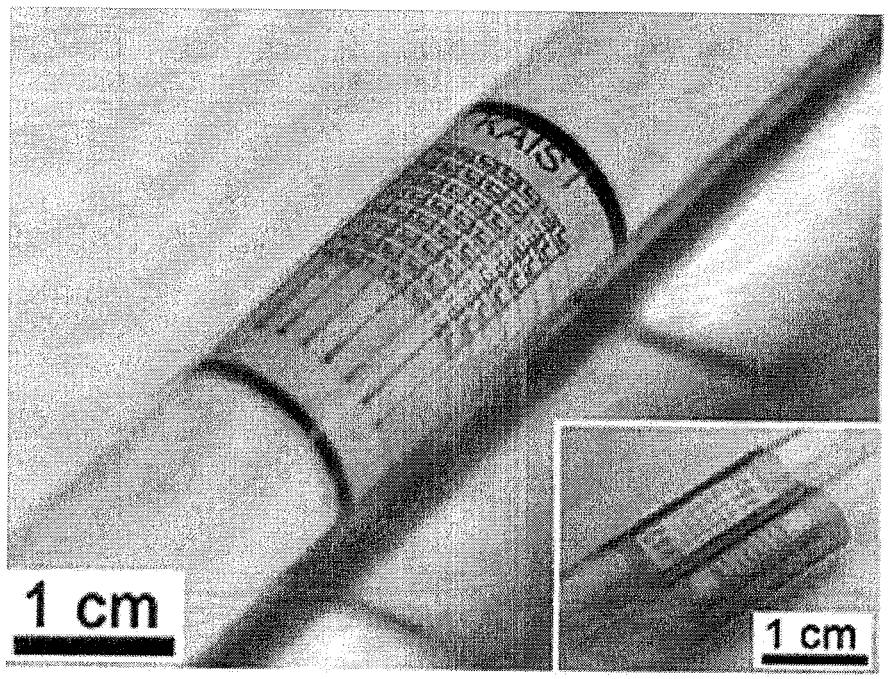

FIG. 48 is a photograph showing the device disclosed herein when it is in a bent form.

Referring to FIG. 48, it can be seen that the device has such a degree of flexibility that it may surround a quartz rod having a diameter of 10 mm. The ductility of a metal line and an ultrathin inorganic material (silicon membrane and amorphous titanium oxide) allows the RRAM device disclosed herein to have excellent stability on a flexible substrate. FIG. 48 is a photograph showing a uniform contact area provided on a curved surface by a flexible RRAM according to an embodiment. Such flexibility is effective for human organisms, such as brain or viscera.

Figure 41:
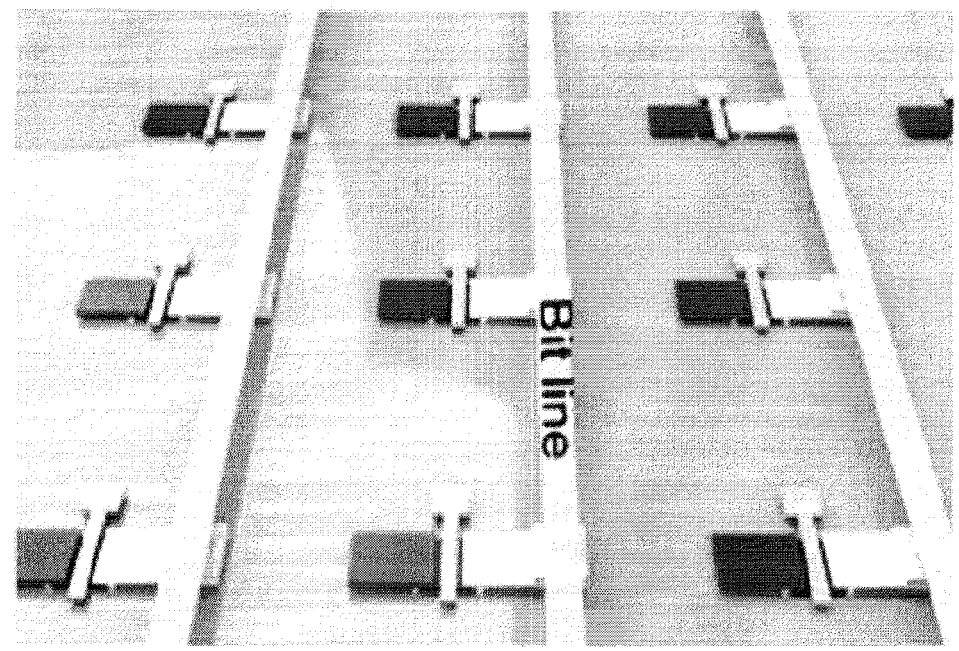
Figure 42:
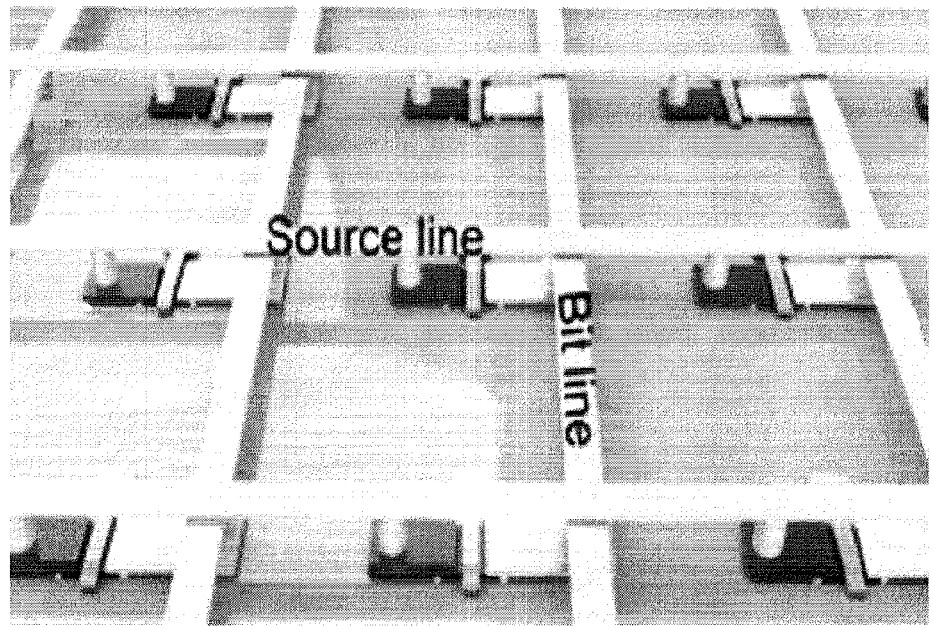
Figure 43:
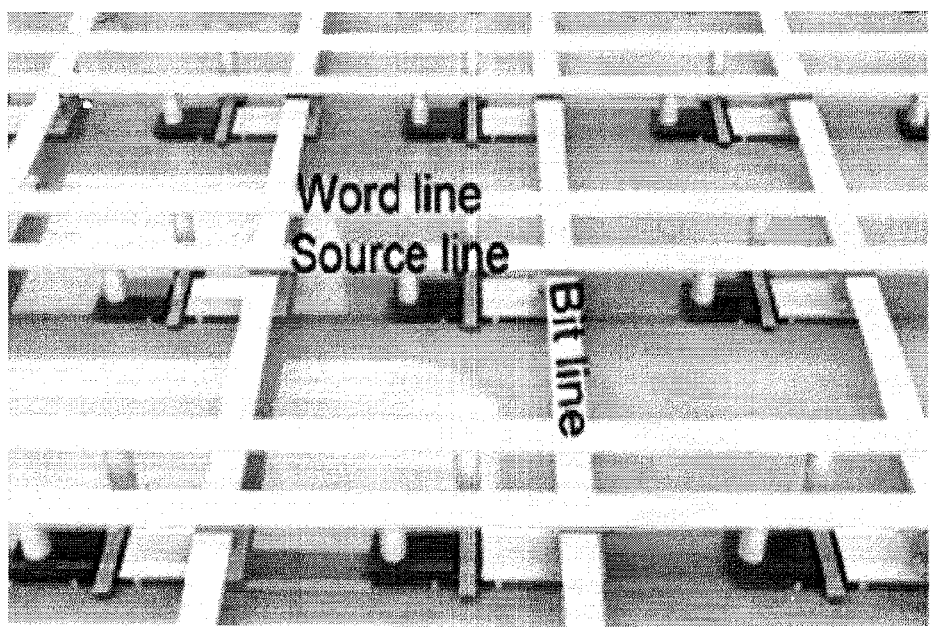
Figure 49:
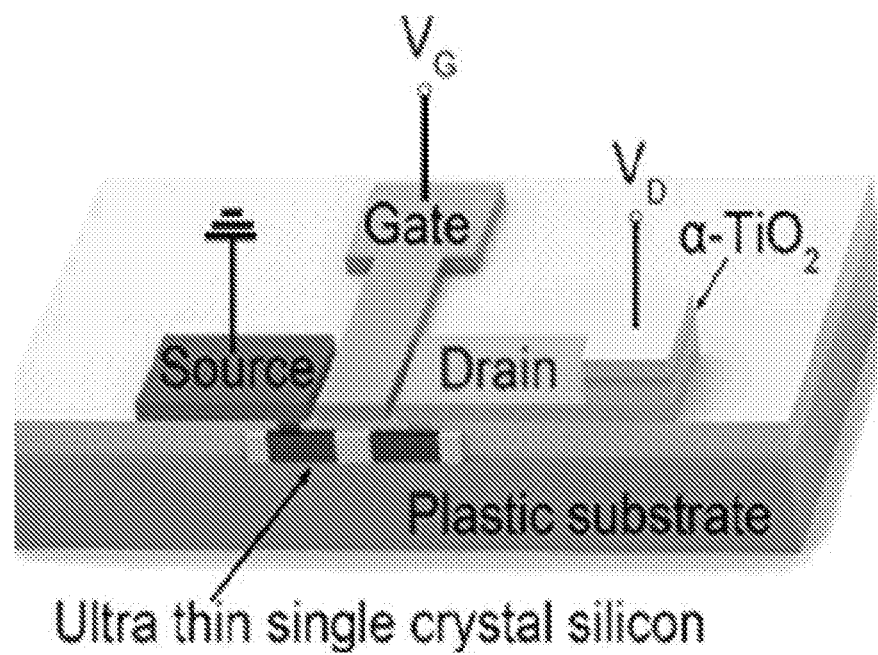
FIG. 49 is a schematic view showing the structure of an RRAM unit cell having two electronic elements.

FIG. 49 is a schematic view showing the structure of an RRAM unit cell having two electronic elements. Herein, the two electronic elements are an $\alpha$-$TiO_2$ layer and NMOSFET based on a bipole resistive memory device. It is possible to control the logic state of the memory device by applying voltage to the source/drain/gate electrodes. FIG. 41 is a graph illustrating the output performance of NMOSFET. The effective device mobility of the transistor disclosed herein is 340 $cm^2$/Vs in a linear region, which may be induced through the transfer curve of the inserted figure of FIG. 3b. At least 500 μA is required to apply a voltage necessary for the switching between the two electrodes. The NMOSFET device satisfies such conditions at a low driving voltage ($I_A$~500 μA at $V_A$=1V, $V_1$=4V). The above results demonstrate that the flexible transistor using ultrathin monocrystalline silicon as an active layer may be used as a switching memory device effective in terms of sufficient current level and ON/OFF ratio.

Figure 50:
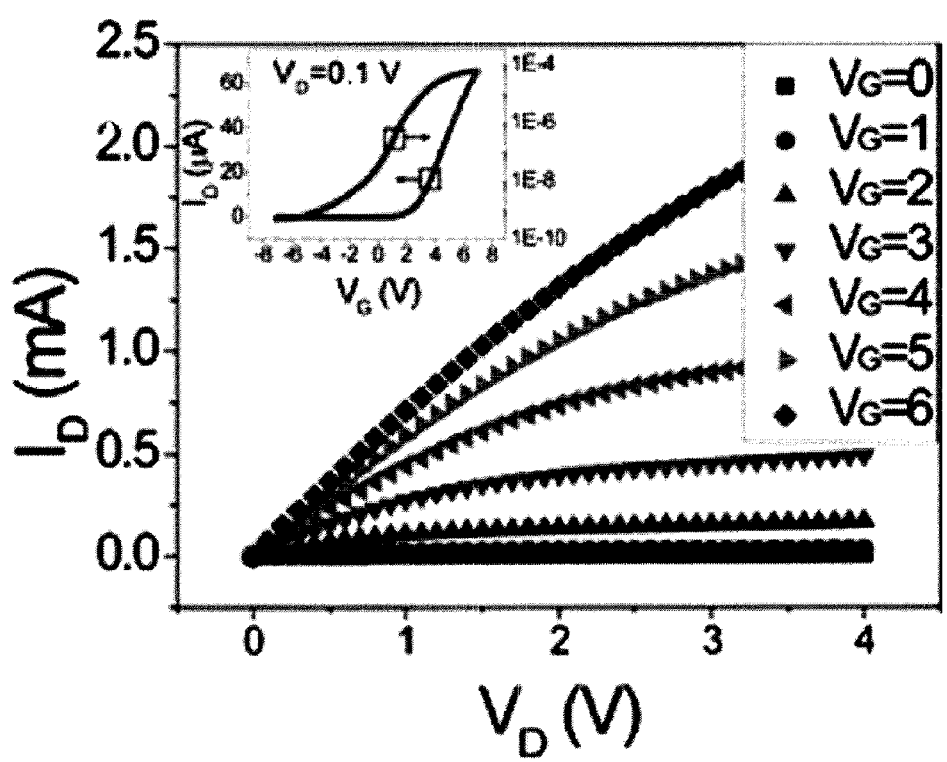
FIG. 50 is a typical graph showing a drain current-drain voltage ($I_D$-$V_D$) curve of the flexible RRAM device according to an embodiment.

FIG. 50 is a typical graph showing a drain current-drain voltage ($I_D$-$V_D$) curve of the flexible RRAM device according to an embodiment. In this embodiment, a voltage of 10V is applied to the gate electrode, and the source electrode is grounded to open channels. The device undergoes a switching from a high resistance state (HRS) to a low resistance state (LRS) as the drain voltage is swept from 0V to a negative voltage to the SET voltage. LRS still maintains even when the voltage is recovered to a positive RESET voltage. This suggests that the RRAM memory device shows asymmetric bipole resistive switching (BRS) behavior. To analyze current conduction mechanism more precisely, a dual log plot of the $I_D$-$V_D$ curve in a negative voltage region is inserted as FIG. 2c. The $I_D$-$V_D$ plot of HRS shows ohmic conduction behavior ($|I_D| \propto |V_D|$), and undergoes a gradual change into square dependent property ($|I_D| \propto |V_D|^2$) as shown in FIG. 3c. After a rapid increase in current at a SET voltage of 2.1V, the memory state is changed into LRS. Particularly, the gradient of log I-log V in a high voltage region is slightly less than 2 (1.7). This means that current conduction may not be explained simply by electronic trapping and detrapping. Therefore, current conduction may be explained by a change in trap distribution in the upper interface layer (Al—Ti—O), generated from behavior of oxide ion caused by external bias.

Figure 51:
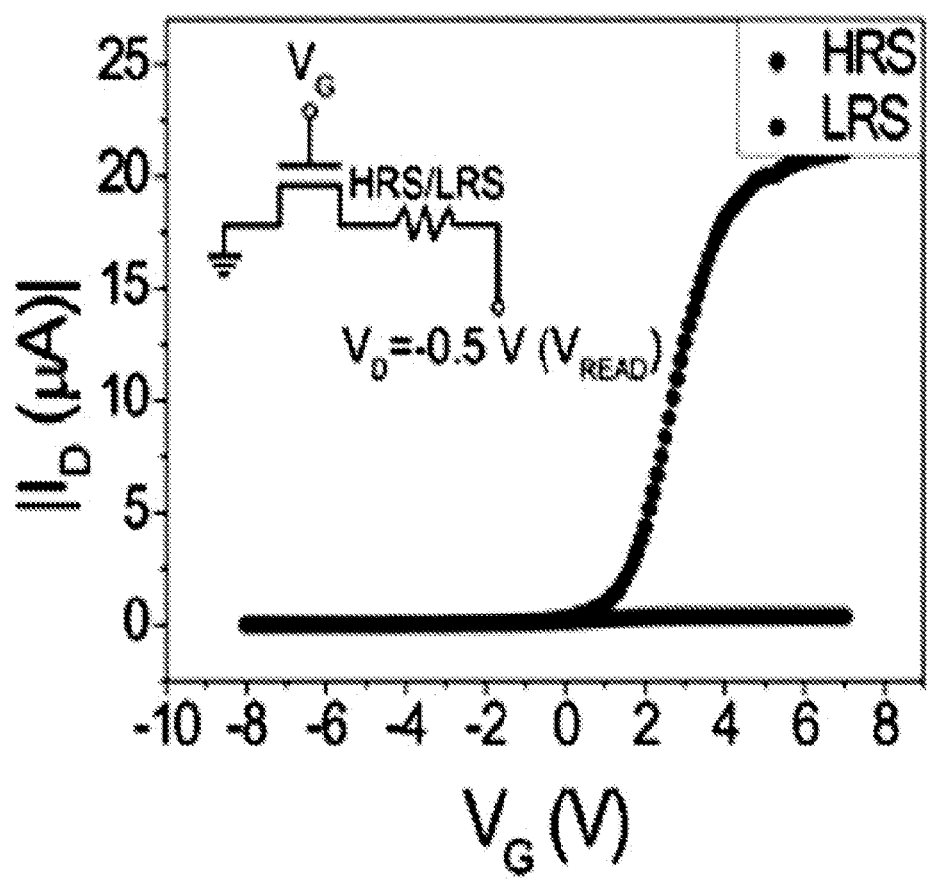
FIG. 51 is drain current-gate voltage (ID-VG) curves of the 1T-1R flexible RRAM device according to an embodiment at a leading voltage of −0.5V in low resistance state (LRS) and high resistance state (HRS)

FIG. 51 is drain current-gate voltage ($I_D$-$V_G$) curves of the 1T-1R flexible RRAM device according to an embodiment at a leading voltage of −0.5V in LRS and HRS. Referring to FIG. 51, drain current shows clear distinguishability depending on states of memory. This suggests that the logic state of a unit cell may be identified easily at a fixed leading voltage.

A test for durability and maintenance characteristics is carried out to investigate the reliability of the flexible RRAM disclosed herein.

Figure 52:
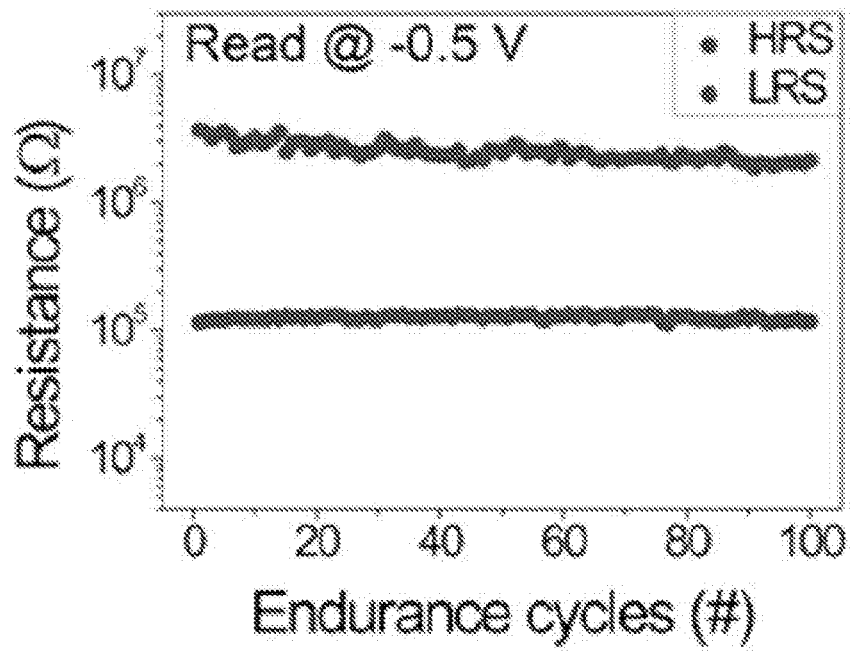
FIG. 52 shows results of a durability cycling test at a leading voltage of 0.5V obtained by repeating on/off sweeping operations.

FIG. 52 shows results of a durability cycling test at a leading voltage of 0.5V obtained by repeating on/off sweeping operations.

Figure 53:
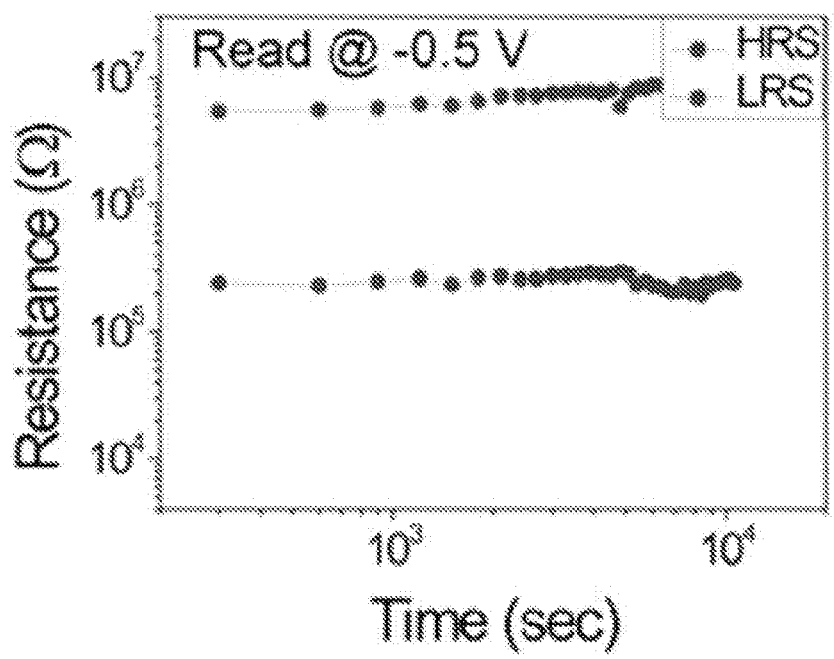
FIG. 53 is a graph illustrating excellent maintenance for $10^4$ seconds without electrical deterioration in LRS and HRS states.

Referring to FIG. 52, during 100 cycles, both HRS and LRS maintain their resistance values with no particular change at the leading voltage. This suggests reproducible resistive switching characteristics. The maintenance/retaining characteristics of 1T-1R RRAM are analyzed at room temperature and data storability is evaluated as shown in FIG. 52. The resistance values in HRS and LRS are analyzed every 300 seconds under the conditions of a gate open voltage of 10V and a leading voltage of −0.5V. Referring to FIG. 53, the 1T-1R RRAM shows excellent maintenance for $10^4$ seconds without electrical deterioration in LRS and HRS.

Figure 54:
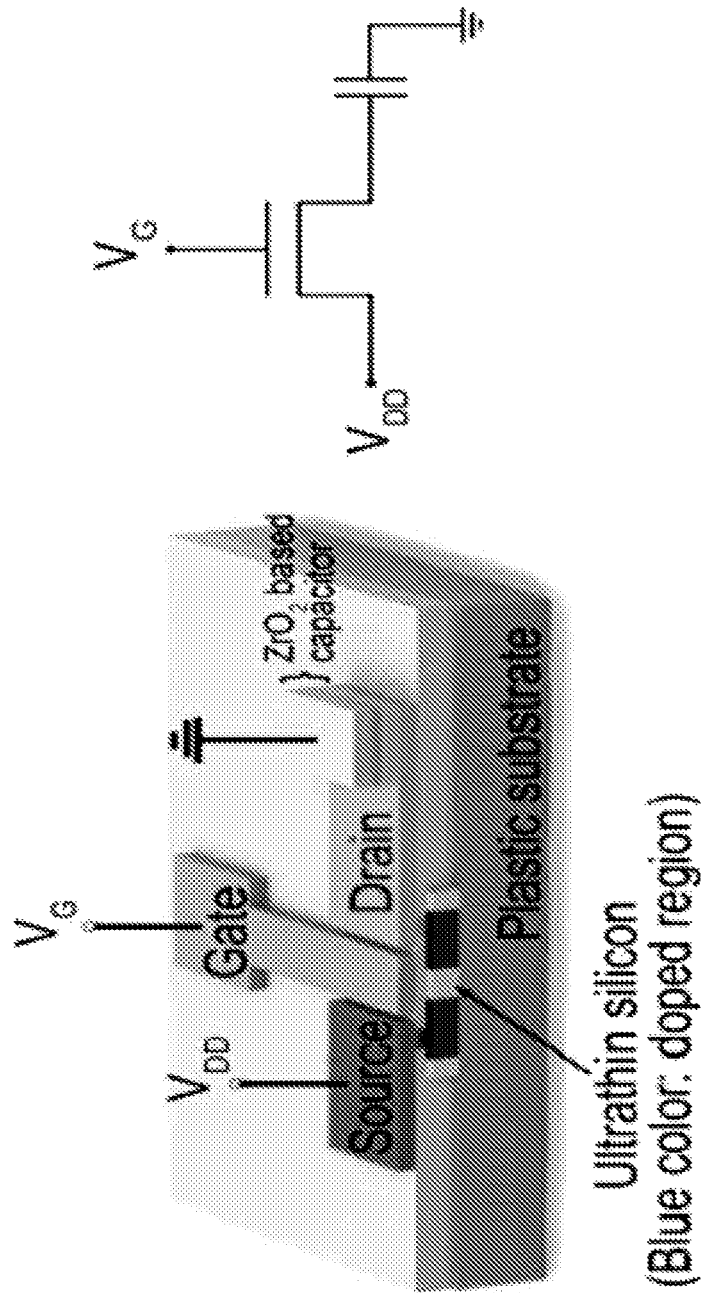
FIG. 54 and FIG. 55 are schematic views illustrating 1T-1C $ZrO_2$ capacitor DRAM and one diode-one resistor (1D-1R) GST phase-change memory using a silicon high-performance switching device.
Figure 55:
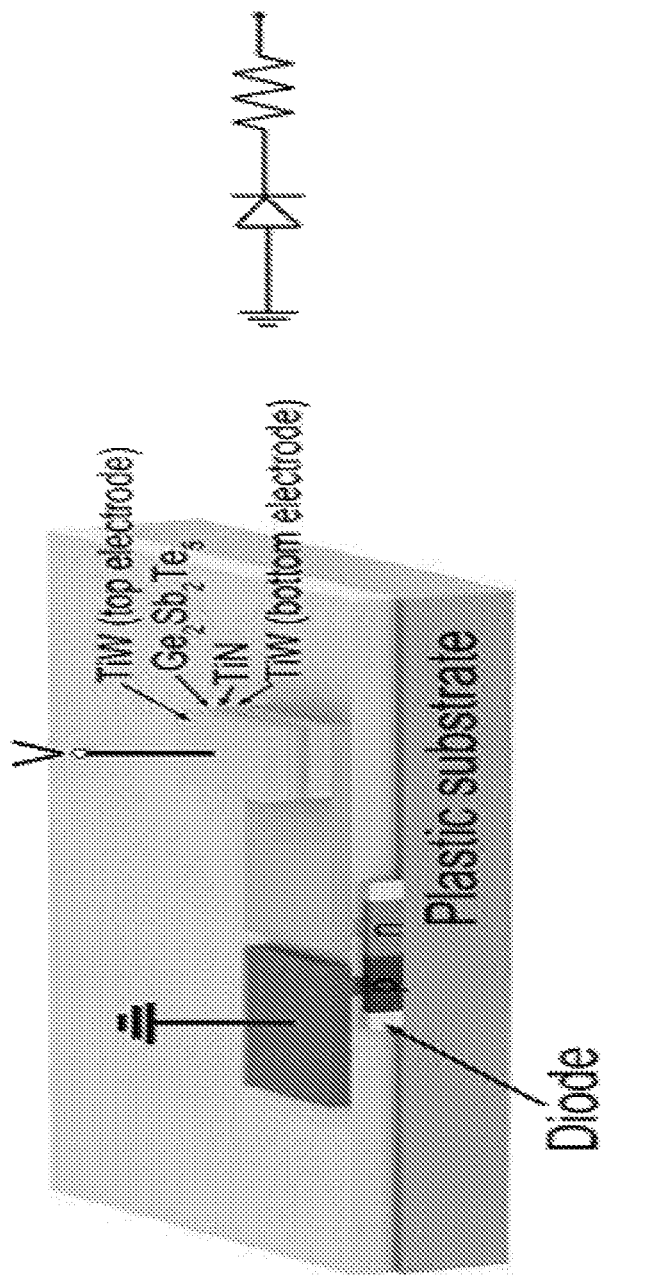

According to another embodiment, monocrystalline silicon transferred from a silicon substrate and multicrystalline silicon crystallized on a plastic substrate are used as high-performance switching devices. FIG. 54 and FIG. 55 are schematic views illustrating 1T-1C $ZrO_2$ capacitor DRAM and one diode-one resistor (1T-1R) GST phase-change memory, respectively.

As can be seen from the foregoing, the phase-change memory device disclosed herein controls an interface between a phase-change material and a Joule heating electrode (bottom electrode) contact to reduce powder consumption of phase-change memory. More particularly, interface control through self-assemblage of a block copolymer is used to reduce the contact area between the electrode and the phase-change material, thereby reducing RESET current, resulting in a drop in power consumption of memory. In this manner, the phase-change memory device disclosed herein reduces power consumption of memory by reducing RESET current, and is effective for overcoming technical limitation of photolithography that occurs due to a significant increase in integration degree. In addition, according to some embodiments, a high-performance silicon device is used as a switching device so that various types of flexible memory devices are obtained. Particularly, a memory array may be realized on a flexible substrate through one switching device and one memory structure. Further, in the case of RRAM, PRAM or DRAM, a high-performance flexible silicon transistor may be integrated with amorphous $TiO_2$ ($\alpha$-$TiO_2$)-based bipole resistive memory, GST phase-change memory, $ZrO_2$ capacitor memory element, etc., to control logic states of memory.

While the exemplary embodiments have been shown and described, it will be understood by those skilled in the art that various changes in form and details may be made thereto without departing from the spirit and scope of the present disclosure as defined by the appended claims.

In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A flexible phase-change memory device comprising:
   a flexible substrate; and
   a phase-change memory device disposed on the flexible substrate and including a phase-change layer and a bottom electrode,
   a flexible silicon semiconductor;
   a doped source/drain layer formed on the flexible silicon semiconductor;
   a word-line electrode and a bit-line electrode each connected to a doped region of the doped source/drain layer; and
   the phase-change layer and the bottom electrode stacked sequentially on the bit-line electrode,
   wherein insulating nanoparticles formed from a block copolymer are interposed between the phase-change layer and the bottom electrode.

2. The flexible phase-change memory device according to claim 1, wherein the flexible silicon semiconductor is monocrystalline silicon.

3. The flexible phase-change memory device according to claim 1, wherein the block copolymer is any one selected from the group consisting of polystyrene-polydimethylsiloxane, polystyrene-polymethylmethacrylate, polystyrene-poly(2-vinylpyridine), poly(2-vinylpyridine)-polydimethylsiloxane, and polystyrene-polyferrocenylsilane.

4. The flexible phase-change memory device according to claim 1, wherein the block copolymer is a silicon-containing block copolymer and the insulating nanoparticles include silicon oxide.

5. The flexible phase-change memory device according to claim 1, wherein the block copolymer is polystyrene-polydimethylsiloxane or polystyrene-polyferrocenylsilane.

* * * * *